United States Patent
Holland et al.

(10) Patent No.: US 12,244,271 B2
(45) Date of Patent: Mar. 4, 2025

(54) FAN-OUT MULTI-STAGE AMPLIFIER WITH CONFIGURABLE PATHS

(71) Applicant: QUALCOMM Incorporated, San Diego, CA (US)

(72) Inventors: Kyle David Holland, San Diego, CA (US); Jang Joon Lee, San Diego, CA (US); Rahul Kodkani, San Diego, CA (US); Aleksandar Miodrag Tasic, San Diego, CA (US); Chih-Fan Liao, San Diego, CA (US); Lai Kan Leung, San Marcos, CA (US); Chiewcharn Narathong, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 631 days.

(21) Appl. No.: 17/448,870

(22) Filed: Sep. 24, 2021

(65) Prior Publication Data

US 2023/0099161 A1    Mar. 30, 2023

(51) Int. Cl.
*H03F 3/68* (2006.01)
*H03F 1/56* (2006.01)
(Continued)

(52) U.S. Cl.
CPC ............... *H03F 3/19* (2013.01); *H03F 1/56* (2013.01); *H03F 3/211* (2013.01);
(Continued)

(58) Field of Classification Search
CPC ........ H03F 3/19; H03F 1/56; H03F 2200/222; H03F 2200/294; H03F 2200/451;
(Continued)

(56) References Cited

U.S. PATENT DOCUMENTS

| | | | | | |
|---|---|---|---|---|---|
| 3,778,644 | A | * | 12/1973 | Kohlhammer | H03H 11/42 327/552 |
| 9,374,043 | B2 | * | 6/2016 | Wang | H03F 1/223 |

(Continued)

FOREIGN PATENT DOCUMENTS

| WO | WO-2015175349 A1 | 11/2015 |
|---|---|---|
| WO | WO-2015183847 A1 | 12/2015 |

OTHER PUBLICATIONS

De Souza, M., "Digitally Controlled CMOS Low Noise Amplifier for Adaptative Radio", Electronics, HAL Archives-Ouvertes.fr, Feb. 10, 2018, pp. 1-147, https://tel.archives-ouvertes.fr/tel-01705889.

(Continued)

*Primary Examiner* — Khanh V Nguyen
(74) *Attorney, Agent, or Firm* — Norton Rose Fulbright US LLPQualcomm Incorporated

(57) ABSTRACT

An amplifier may include multiple stages, with the multiple stages arranged in a fan-out configuration. The fan-out configuration provides multiple amplified signals at multiple amplifier output nodes, which may be coupled to a shared set of downconverters. The shared downconverters may support processing of only a smaller bandwidth than the largest possible bandwidth of an input RF signal input to the amplifier. For example, the downconverters may support a bandwidth matching a smallest bandwidth of a supported RF signal. For example, when the amplifier is intended to support 5G mmWave RF signals and 5G sub-6 GHz RF signals, the downconverters may each individually support a bandwidth of carriers in the 5G sub-6 GHz RF signals but not individually support the entire bandwidth of a possible 5G mmWave RF signal.

32 Claims, 14 Drawing Sheets

(51) Int. Cl.
*H03F 3/19* (2006.01)
*H03F 3/21* (2006.01)

(52) U.S. Cl.
CPC .. *H03F 2200/222* (2013.01); *H03F 2200/294* (2013.01); *H03F 2200/451* (2013.01)

(58) Field of Classification Search
CPC ................ H03F 3/211; H03F 2200/111; H03F 2203/7209; H03F 3/72; H03F 2203/7233; H03F 3/189; H04B 1/16; H04B 1/18
USPC ........................................................ 330/301
See application file for complete search history.

(56) References Cited

U.S. PATENT DOCUMENTS

| | | | | |
|---|---|---|---|---|
| 9,379,673 | B2* | 6/2016 | Wang | .................... H03F 3/193 |
| 2007/0207752 | A1* | 9/2007 | Behzad | .................... H04B 1/18 |
| | | | | 455/132 |
| 2009/0160556 | A1 | 6/2009 | Wiklund | |
| 2016/0087587 | A1 | 3/2016 | Wang et al. | |
| 2016/0105537 | A1* | 4/2016 | Iida | ...................... H03H 11/344 |
| | | | | 370/277 |
| 2016/0226460 | A1* | 8/2016 | Pullela | ..................... H04B 1/16 |
| 2017/0366143 | A1 | 12/2017 | Komiak | |
| 2018/0048271 | A1* | 2/2018 | Patel | ......................... H03F 3/19 |
| 2018/0131340 | A1 | 5/2018 | Yin et al. | |
| 2018/0145634 | A1 | 5/2018 | Kim et al. | |
| 2018/0248526 | A1 | 8/2018 | Lee et al. | |

OTHER PUBLICATIONS

International Search Report and Written Opinion—PCT/US2022/075764—ISA/EPO—Jan. 4, 2023.
Yeh E-H V., et al., "A 16 nm FinFET 0.4 V Inductor-Less Cellular Receiver Front-End with 10 mW Ultra-low Power and 0.3 mm$^2$ Ultra-Small Area for 5G System in Sub-6 GHz Band", 2017 Symposium on VLSI Circuits, JSAP, Jun. 5, 2017, pp. 1-2, XP033141463, p. 1, left-hand column, line 20—p. 2, left-hand column, line 32, figures 1-5.

* cited by examiner

FAN-OUT MULTI-STAGE AMPLIFIER WITH CONFIGURABLE PATHS

FIELD OF THE DISCLOSURE

Aspects of the present disclosure relate generally to wireless communication systems, and more particularly, to radio frequency (RF) processing circuitry for wireless communication systems. Some features may enable and provide improved communications, including improved low noise amplifier (LNA) designs.

BACKGROUND

Wireless communication networks are widely deployed to provide various communication services such as voice, video, packet data, messaging, broadcast, and the like. These wireless networks may be multiple-access networks capable of supporting multiple users by sharing the available network resources. Such networks may be multiple access networks that support communications for multiple users by sharing the available network resources.

A wireless communication network may include several components. These components may include wireless communication devices, such as base stations (or node Bs) that may support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on a downlink to a UE or may receive data and control information on an uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

Low noise amplifiers (LNAs) are electronic components that amplify a signal to generate a higher strength signal that improves processing of the signal and increases the likelihood of successfully recovering data embedded in the signal. LNAs are amplifiers that operate on low-power signals, such as the small signals received over a small antenna in a small mobile device. LNAs operate on these small signals without causing a significant loss in signal-to-noise ratio (SNR) of the received signal. RF circuitry with LNAs conventionally include matching inductors to achieve good input match between the LNA and other RF circuitry. These inductors come at increased cost due to increased die area of RF circuitry chips by including inductances, potential need of external components to provide inductance, potential need of additional package layers to provide space for inductances, and creation of isolation concerns. Further, existing LNAs may be limited to efficiently amplifying certain frequencies and/or by the bandwidth of frequencies they can efficiently amplify. Other challenges (e.g., in architecture or configuration of components other than an LNA) may exist in processing signals of different frequency and/or bandwidth.

Shortcomings mentioned here are only representative and are included to highlight problems that the inventors have identified with respect to existing devices and sought to improve upon. Aspects of devices described below may address some or all of the shortcomings as well as others known in the art. Aspects of the improved devices described below may present other benefits than, and be used in other applications than, those described above.

BRIEF SUMMARY OF SOME EXAMPLES

A solution to better supporting multiple networks in a UE may include sharing of components, such as downconverter circuits, across different wireless networks using different wireless network technologies. For example, wireless network technologies with different bandwidth usage may be processed through the same downconverter circuits and/or by baseband filters which are configured substantially similarly. In some aspects, the downconverter circuits may be configured to process RF signals with a bandwidth corresponding to a bandwidth of the smaller-bandwidth wireless network technology, and multiple of the downconverter circuits may be operated in parallel to support processing a larger bandwidth signal of another wireless network technology. Further, in some aspects, better isolation and lower cost receivers may be enabled in some embodiments of this disclosure with an inductor-less LNA solution. In some aspects, the amplifiers may be configured with inverter-based LNAs. An amplifier may include multiple stages, with the multiple stages arranged in a fan-out configuration that provides an LNA matrix. The fan-out configuration may provide multiple amplified signals at multiple amplifier output nodes, which may be coupled to a shared set of downconverters. The shared downconverters may support processing of only a smaller bandwidth than the largest possible bandwidth of an input RF signal input to the amplifier. For example, the downconverters may support a bandwidth matching a smallest bandwidth of a supported RF signal. For example, when the amplifier is intended to support 5G mmWave RF signals and 5G sub-6 GHz RF signals, the downconverters may each individually support a bandwidth of carriers in the 5G sub-6 GHz RF signals but not individually support the entire bandwidth of a possible 5G mmWave RF signal. The fan-out configuration produces multiple amplifier output signals that can be used to process the larger bandwidth RF signal, such as RF signals comprising direct 5G mmWave RF signals and/or RF signals comprising IF signals downconverted from direct 5G mmWave RF signals, in smaller portions through the downconverters that are shared between different types of RF signals. The downconverters may be used on the smaller bandwidth RF signals to support carrier aggregation (CA) functionality by processing different carriers simultaneously amplified through the fan-out configuration.

A multi-stage (e.g., two-stage or N-stage) inductor-less amplifier (e.g., with $1^{st}$-stage gLNA, $2^{nd}$-stage LNA, and $3^{rd}$-stage LNA) may overcome the issues of achieving good match under carrier aggregation or other large bandwidth signal scenarios. The first-stage (e.g., a gyrator LNA or gLNA) can focus on achieving good match and presenting a controlled (e.g., higher) impedance to the second stage LNA. The second and/or later stages of the multi-stage amplifier may provide additional gain and multi-carrier split through a fan-out configuration, as well as a more predictable interface for the first-stage (e.g., the gLNA). For example, cascaded LNA stages for RF circuitry in a cellular radio may increase in number of LNAs from a first stage to second or later stages in a fan-out configuration. The cascaded stages may divide a wide-band input RF signal into smaller bandwidths for processing through downconverters with baseband filters (such as by breaking a mmWave signal into smaller portions for processing in 4G/5G baseband filters (BBFs)). The frequency splitting provided through the second and later stages allow large bandwidth RF signals (e.g., 1400 MHz bandwidth mmWave signals) to be divided into smaller portions, similar to that of 5G sub-6 GHz RF signals, such that downconverters with sub-6 GHz BBFs can be used to process 5G mmWave RF signals. The multi-stage amplifier may result in a single transceiver chip (or single integrated circuit (IC)) capable of processing 5G sub-6GHz and 5G mmWave RF signals. In some embodiments, the single transceiver chip is configured to process RF signals comprising one for more of 5G sub-6 GHz RF signals and/or 5G mmWave IF signals (e.g., in the 7-15 GHz range) that have been downconverted from a 5G mmWave direct RF frequency. The single transceiver chip may also be configured to process 2G, 3G, and/or 4G signals.

Some particular RF signal processing operations may thus be configured to be supported on a single chip or IC using the amplifier. In some embodiments, the described RF circuitry with fan-out amplifier may support legacy+sub-6+ mmWave CA combinations, such as n5A_n2A_n66A_n77 (2A)_n260M, using a single-chip or single IC receiver solution. In some embodiments, enhanced receiver performance is achieved for carrier aggregation for 1.8-7 GHz, including 5GNR cases of n77+n77+n77+B42, n77+n77+ n77, or n79+n79, and/or 4G LTE cases, including B46+B46, B41+B41+B41, or B3+B3. In some embodiments, the RF circuit may be configured to support a mmWave IF frequency range of 7.2-14 GHz, to handle cases such as n258+n260 inter-band CA, and to handle intra-band CA with large IBW>600 MHz. In some embodiments, the RF circuit may be configured to support a receiver operating in CA combo n41+n41+n41+n41 or n77+n77+n77+B42 (1 primary cell or path and 3 secondary cells or paths), with 1-3 second cells or paths toggling on/off. In some embodiments, the RF circuit may be configured for supporting mmWave IF for operations in n258+n260 intra-module CA, and switch to inter-module CA. In some embodiments, the RF circuitry may support large IBW for mmWave (1.4 GHz) by RF splitting into multiple 200-600 MHz downlink pipes/paths (DLPs) (e.g., 3×400 MHz+200 MHz or 2×600 MHz+200 MHz), and the DLPs may be shared between 2G/3G/4G/5G (sub-6+legacy+mmWave). The same receiver circuit may also be reconfigured for 2G/3G/4G operation, including GSM, (W)CDMA, TDSCDMA, and LTE. In some embodiments, the RF circuit may be configured to support for supporting frequency range 3 (FR3) operations, for example having one or more frequencies in a range from 8-22 GHz.

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In one aspect of the disclosure, an apparatus includes at least one input node, a plurality of amplifier output nodes, and an amplifier configured to couple and/or coupled to the at least one input node and to the plurality of amplifier output nodes, wherein the amplifier is configured to amplify input RF signals received at the at least one input node for output at a plurality of amplifier output nodes. The amplifier may include a first stage comprising at least one first low noise amplifier (LNA) coupled to the input node and to at least one first stage output node; and a fan-out stage comprising at least two second LNAs configured to be coupled to the at least one first stage output node and to the plurality of amplifier output nodes. In some embodiments, at least one of the at least two second LNAs comprises a configurable feedback loop, which may be included in any of the embodiments described herein. The fan-out stage may include a second stage, a third stage, a fourth stage, and/or additional stages, with each stage providing a fan-out to more outputs than inputs, in which each of the more outputs provide at least a subset of carriers at each of the plurality of amplifier output nodes, which may be used for separately processing individual carriers or a portion of bandwidth in the input RF signal. The apparatus may further include a plurality of downconverters, wherein the plurality of downconverters are separately coupled to the plurality of amplifier output nodes to process separate portions of a bandwidth of the input RF signal received at the input node. In some aspects, the plurality of downconverters are configured to provide carrier aggregation (CA) processing when the input RF signal comprises 5G sub-6 GHz RF signals, configured to provide 5G mmWave processing when the input RF signal comprises 5G mmWave RF signals, and/or configured to provide carrier aggregation across wide spectrums such as between 5G mmWave and 5G sub-6 signals. In some aspects, the first stage may include multiple LNAs coupled in parallel between an input node for the input RF signal with at least one first stage output node, with the multiple LNAs controlled by one or more power combining signals to enable or disable based on a desired signal strength at the output of the first stage.

In some aspects, the apparatus may include a 2-stage amplifier in which the fan-out stage includes a second stage of LNAs coupled to a common input at at least one first stage output node. In some aspects, the apparatus may include a 3-stage amplifier in which the fan-out stage includes a second stage of LNAs coupled to a common input at the at least one first stage output node, and configured to output signals to a plurality of second stage output nodes; and a third stage of LNAs comprising at least two sets of LNAs with each of the at least two sets coupled to a common input of the plurality of second stage output nodes, and each of the at least two sets configured to output to the plurality of amplifier output nodes. In some aspects the apparatus may include a 4-stage amplifier in which the fan-out stage includes a second stage of LNAs coupled to a common input at the at least one first stage output node and configured to output signals to a plurality of second stage output nodes; a third stage of LNAs comprising at least two sets of LNAs with each of the at least two sets coupled to a common input at the plurality of second stage output nodes, and the third stage of LNAs configured to output signals to a plurality of third stage output nodes; and a fourth stage of LNAs comprising at least two sets of LNAs with each of the at least two sets coupled to a common input of the plurality of third stage output nodes, and the fourth stage of LNAs configured to output signals to the plurality of amplifier output nodes.

In some aspects, an apparatus may include multiple inputs nodes coupled to one or more first stage amplifiers configured to share the fan-out stage and/or downconverters. For example, the first stage may include a first LNA of the at least one first LNA corresponding to a first wireless technology; and a second LNA of the at least one first LNA corresponding to a second wireless technology. LNAs of the fan-out stage may be coupled through switches and processing paths to allow reconfiguration of the fan-out stage to process input RF signals according to the different wireless technologies. For example, the fan-out stage may include a first set of second-stage LNAs; and a second set of second-stage LNAs. The fan-out stage may also include a first switch configured to couple together inputs of the first set of second-stage LNAs; a second switch configured to coupled together inputs of the second set of second-stage LNAs; a third switch configured to couple the first set of second-stage LNAs to a first LNA of the at least one first LNA; a fourth switch configured to couple the first set of second-stage LNAs to the second set of second-stage LNAs; and/or a fifth switch configured to couple the second set of second-stage LNAs to a second LNA of the at least one first LNA. In some aspects, the apparatus may include a first downconverter of the first set of downconverters is further coupled to a third LNA of the at least one first LNA; and a first downconverter of the second set of downconverters is further coupled to a fourth LNA of the at least one first LNA.

In one aspect of the disclosure, a method includes amplifying an input RF signal received at an amplifier input node by a first stage of low noise amplifiers (LNAs) for output as first signals on at least one first stage output node; amplifying the first signals by a fan-out stage of LNAs for output as amplifier output signals on a plurality of amplifier output nodes; adjusting a configurable feedback loop of at least one LNA of the fan-out stage to match impedance between the fan-out stage and the first stage; and downconverting the amplifier output signals from the plurality of amplifier output nodes by processing a portion of a bandwidth of the input RF signal in each of a plurality of mixers. In some aspects, the method includes downconverting separate carriers of the amplifier output signals through separate mixers of the plurality of mixers when the input RF signal comprises carrier aggregation (CA) 5G sub-6 GHz RF signals; and downconverting separate portions of a bandwidth of the input RF signal through separate mixers of the plurality of mixers when the input RF signal comprises 5G mmWave RF signals. In some aspects, the method may include performing amplifying various RF signals at different nodes as described in example apparatuses described herein, downconverting RF signals to baseband as described in example apparatuses described herein, and/or controlling components of the apparatuses according to example techniques described herein.

In one aspect of the disclosure, an apparatus includes means for amplifying an input RF signal received at an amplifier input node for output as first signals on at least one first stage output node; and means for fanning out the first signals for output as amplifier output signals on a plurality of amplifier output nodes, wherein the fanning means comprises means for adjusting an impedance on the amplifying means. In some aspects, the apparatus may also include means for separately downconverting the amplifier output signals from the plurality of amplifier output nodes by separately processing individual portion of a bandwidth of the input RF signal; inter-band splitting means for splitting a plurality of carriers in the input RF signal; intra-band splitting means for splitting the plurality of carriers in the input RF signal; carrier aggregation splitting means for splitting a plurality of carriers in the input RF signal; means for amplifying a second input RF signal received at a second amplifier input node; and/or means for sharing the fanning out means between the input RF signal amplifying means and the second input RF signal amplifying means.

In an additional aspect of the disclosure, an apparatus is disclosed that includes at least one processor, and a memory coupled to the at least one processor. The at least one processor is configured to perform any of the methods or techniques described herein. For example, the at least one processor may be configured to perform steps including controlling an adjustable feedback of one or more of the LNAs to match impedances or otherwise control operation of an apparatus including an amplifier according to aspects of this disclosure, such as controlling a power combining signal.

In an additional aspect of the disclosure, a non-transitory computer-readable medium stores instructions that, when executed by a processor, cause the processor to perform operations including those described in the method and techniques described herein. For example, the operations may include controlling an adjustable feedback of one or more of the LNAs to match impedances or otherwise control operation of an apparatus including an amplifier according to aspects of this disclosure, such as controlling a power combining signal.

Other aspects, features, and implementations will become apparent to those of ordinary skill in the art, upon reviewing the following description of specific, exemplary aspects in conjunction with the accompanying figures. While features may be discussed relative to certain aspects and figures below, various aspects may include one or more of the advantageous features discussed herein. In other words, while one or more aspects may be discussed as having certain advantageous features, one or more of such features may also be used in accordance with the various aspects. In similar fashion, while exemplary aspects may be discussed below as device, system, or method aspects, the exemplary aspects may be implemented in various devices, systems, and methods.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Like reference numbers and designations in the various drawings indicate like elements.

DETAILED DESCRIPTION

Figure 1:
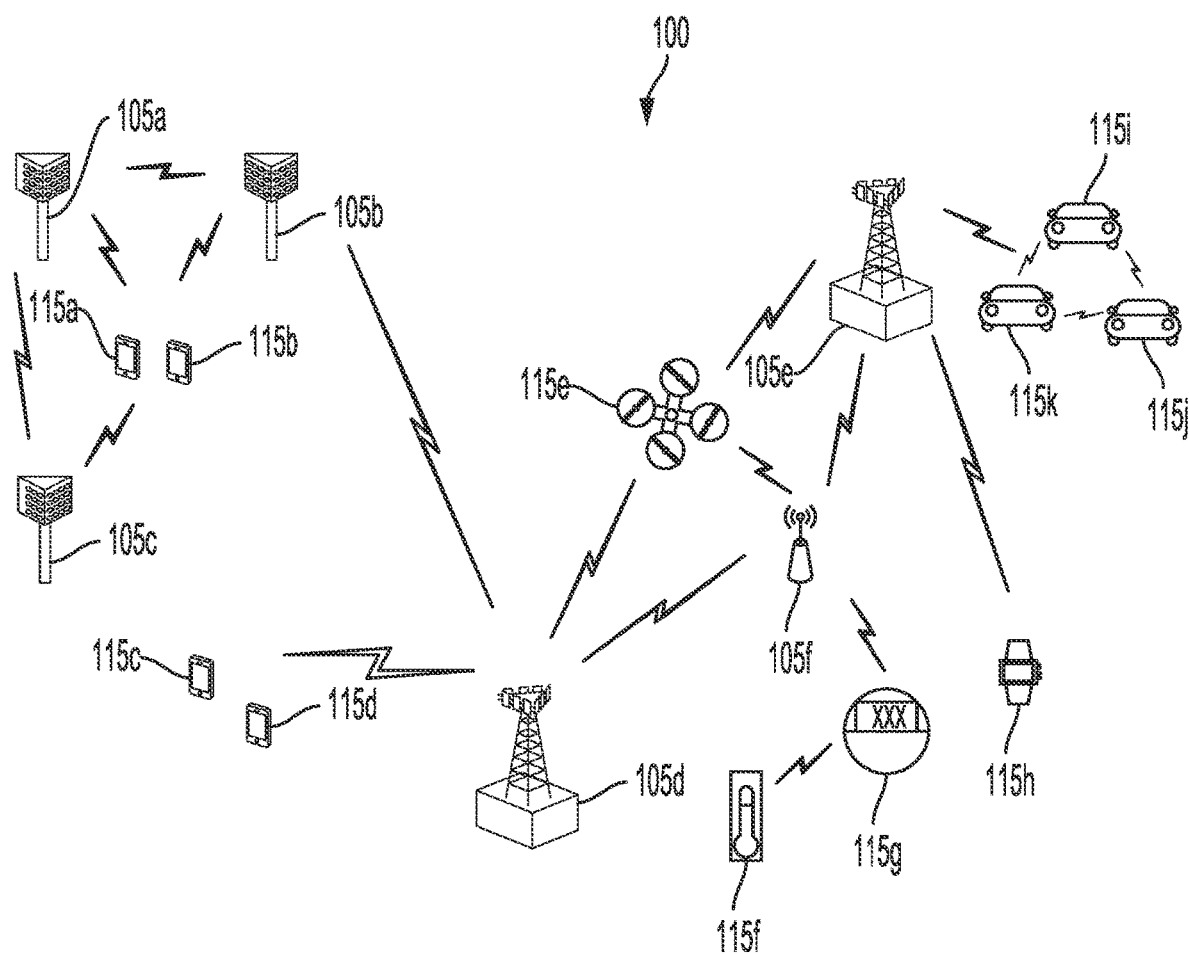
FIG. 1 is a block diagram illustrating details of an example wireless communication system according to one or more aspects.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

This disclosure relates generally to providing or participating in communications (e.g., authorized shared access) between two or more wireless devices in one or more wireless communications systems, also referred to as wireless communications networks. In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, $5^{th}$ Generation (5G) or new radio (NR) networks (sometimes referred to as "5G NR" networks, systems, or devices), as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with UTRANs in the case of a UMTS/GSM network. Additionally, an operator network may also include one or more LTE networks, or one or more other networks. The various different network types may use different radio access technologies (RATs) and RANs.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3GPP is a collaboration between groups of telecommunications associations that aims to define a globally applicable third generation (3G) mobile phone specification. 3GPP LTE is a 3GPP project which was aimed at improving UMTS mobile phone standard. The 3GPP may define specifications for the next generation of mobile networks, mobile systems, and mobile devices. The present disclosure may describe certain aspects with reference to LTE, 4G, or 5G NR technologies; however, the description is not intended to be limited to a specific technology or application, and one or more aspects described with reference to one technology may be understood to be applicable to another technology. Additionally, one or more aspects of the present disclosure may be related to shared access to wireless spectrum between networks using different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1 M nodes/km$^2$), ultra-low complexity (e.g., ~10 s of bits/sec), ultra-low energy (e.g., ~10+years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 millisecond (ms)), and users with wide ranges of mobility or lack thereof; and (3) with enhanced mobile broadband including extreme high capacity (e.g., ~10 Tbps/km$^2$), extreme data rates (e.g., multi-Gbps rate, 100+Mbps user experienced rates), and deep awareness with advanced discovery and optimizations.

Devices, networks, and systems may be configured to communicate via one or more portions of the electromagnetic spectrum. The electromagnetic spectrum is often subdivided, based on frequency or wavelength, into various classes, bands, channels, etc. In 5G NR two initial operating bands have been identified as frequency range designations FR1 (410 MHz—7.125 GHz) and FR2 (24.25 GHz—52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles, and will be referred to herein as "sub-6 GHz". A similar nomenclature issue sometimes occurs with regard to FR2, which is often referred to (interchangeably) as a "millimeter wave" (mmWave) band in documents and articles, despite including frequencies outside of the extremely high frequency (EHF) band (30 GHz—300 GHz) which is identified by the International Telecommunications Union (ITU) as a "mmWave" band.

With the above aspects in mind, unless specifically stated otherwise, it should be understood that the term "sub-6 GHz" or the like if used herein may broadly represent frequencies that may be less than 7 GHz, may be within FR1, or may include mid-band frequencies. Further, unless specifically stated otherwise, it should be understood that the term "mmWave" or the like if used herein may broadly represent frequencies that may include mid-band frequencies, may be within FR2, or may be within the EHF band.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD) design or frequency division duplex (FDD) design; and advanced wireless technologies, such as massive multiple input, multiple output (MIMO), robust mmWave transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD or TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink or downlink scheduling information, data, and acknowledgement in the same subframe. The self-contained integrated subframe supports communications in unlicensed or contention-based shared spectrum, adaptive uplink or downlink that may be flexibly configured on a per-cell basis to dynamically switch between uplink and downlink to meet the current traffic needs.

For clarity, certain aspects of the apparatus and techniques may be described below with reference to example 5G NR implementations or in a 5G-centric way, and 5G terminology may be used as illustrative examples in portions of the description below; however, the description is not intended to be limited to 5G applications.

Moreover, it should be understood that, in operation, wireless communication networks adapted according to the concepts herein may operate with any combination of licensed or unlicensed spectrum depending on loading and availability. Accordingly, it will be apparent to a person having ordinary skill in the art that the systems, apparatus and methods described herein may be applied to other communications systems and applications than the particular examples provided.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail device or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

FIG. 1 is a block diagram illustrating details of an example wireless communication system according to one or more aspects. The wireless communication system may include wireless network 100. Wireless network 100 may, for example, include a 5G wireless network. As appreciated by those skilled in the art, components appearing in FIG. 1 are likely to have related counterparts in other network arrangements including, for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" may refer to this particular geographic coverage area of a base station or a base station subsystem serving the coverage area, depending on the context in which the term is used. In implementations of wireless network 100 herein, base stations 105 may be associated with a same operator or different operators (e.g., wireless network 100 may include a plurality of operator wireless networks). Additionally, in implementations of wireless network 100 herein, base station 105 may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In some other examples, each base station 105 and UE 115 may be operated by a single network operating entity. Either the base station 105 or the UE 115 or other devices communicating on the wireless network 100 (for example, a customer premises equipment (CPE)) may implement embodiments of receiver circuitry described herein.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the implementation illustrated in FIG. 1 are examples of mobile smart phone-type devices accessing wireless network 100. A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 100 may occur using wired or wireless communication links.

In operation at wireless network 100, base stations 105a-105c serve UEs 115a and 115b using 3D beamforming and coordinated spatial techniques, such as coordinated multipoint (CoMP) or multi-connectivity. Macro base station 105d performs backhaul communications with base stations 105a-105c, as well as small cell, base station 105f. Macro base station 105d also transmits multicast services which are subscribed to and received by UEs 115c and 115d. Such multicast services may include mobile television or stream video, or may include other services for providing community information, such as weather emergencies or alerts, such as Amber alerts or gray alerts.

Wireless network 100 of some implementations supports mission critical communications with ultra-reliable and redundant links for mission critical devices, such UE 115e, which is a drone. Redundant communication links with UE 115e include from macro base stations 105d and 105e, as well as small cell base station 105f. Other machine type devices, such as UE 115f (thermometer), UE 115g (smart meter), and UE 115h (wearable device) may communicate through wireless network 100 either directly with base stations, such as small cell base station 105f, and macro base station 105e, or in multi-hop configurations by communicating with another user device which relays its information to the network, such as UE 115f communicating temperature measurement information to the smart meter, UE 115g, which is then reported to the network through small cell base station 105f. Wireless network 100 may also provide additional network efficiency through dynamic, low-latency TDD communications or low-latency FDD communications, such as in a vehicle-to-vehicle (V2V) mesh network between UEs 115i-115k communicating with macro base station 105e.

Figure 2:
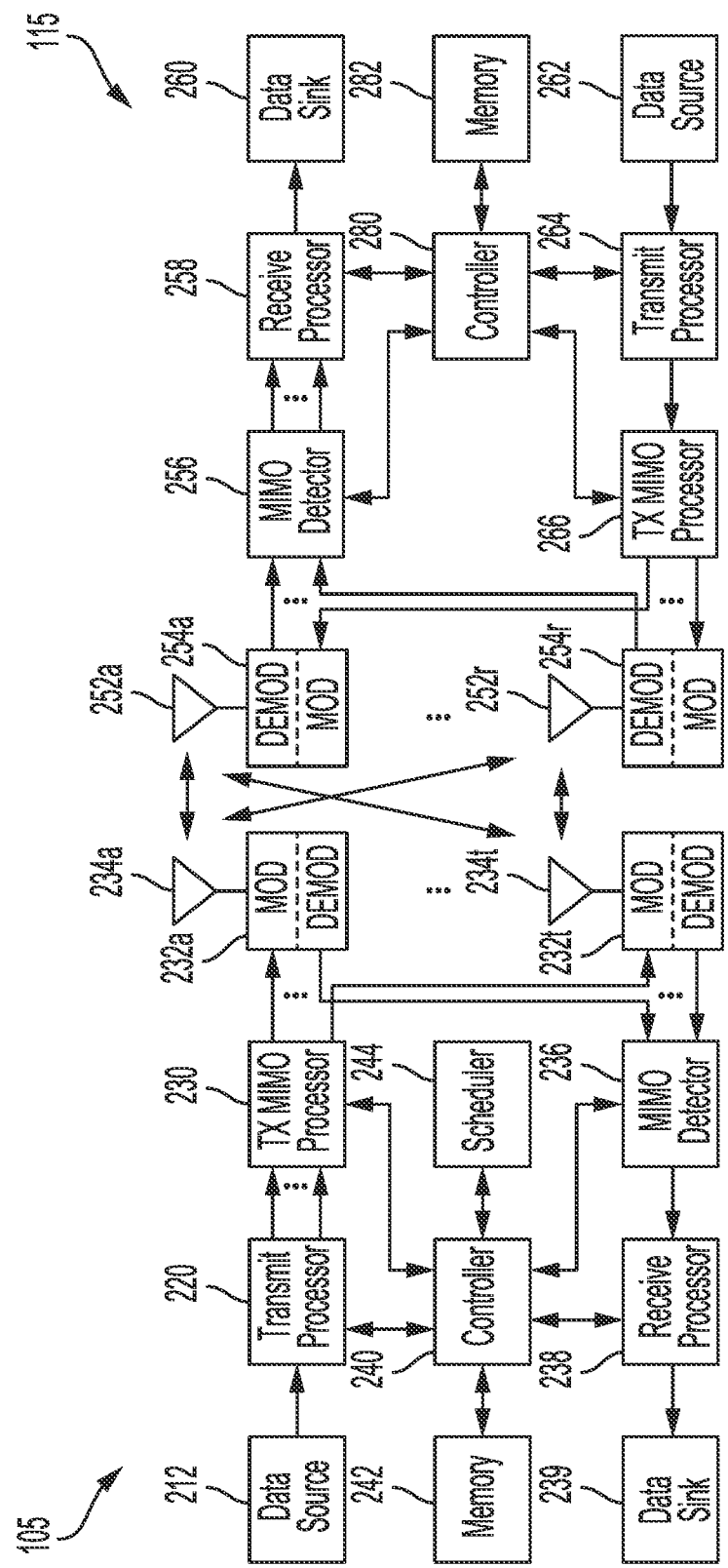
FIG. 2 is a block diagram illustrating examples of a base station and a user equipment (UE) according to one or more aspects.

FIG. 2 is a block diagram illustrating examples of base station 105 and UE 115 according to one or more aspects. Base station 105 and UE 115 may be any of the base stations and one of the UEs in FIG. 1. For a restricted association scenario (as mentioned above), base station 105 may be small cell base station 105f in FIG. 1, and UE 115 may be UE 115c or 115d operating in a service area of base station 105f, which in order to access small cell base station 105f, would be included in a list of accessible UEs for small cell base station 105f. Base station 105 may also be a base station of some other type. As shown in FIG. 2, base station 105 may be equipped with antennas 234a through 234t, and UE 115 may be equipped with antennas 252a through 252r for facilitating wireless communications.

At base station 105, transmit processor 220 may receive data from data source 212 and control information from controller 240, such as a processor. The control information may be for a physical broadcast channel (PBCH), a physical control format indicator channel (PCFICH), a physical hybrid-ARQ (automatic repeat request) indicator channel (PHICH), a physical downlink control channel (PDCCH), an enhanced physical downlink control channel (EPDCCH), an MTC physical downlink control channel (MPDCCH), etc. The data may be for a physical downlink shared channel (PDSCH), etc. Additionally, transmit processor 220 may process (e.g., encode and symbol map) the data and control information to obtain data symbols and control symbols, respectively. Transmit processor 220 may also generate reference symbols, e.g., for the primary synchronization signal (PSS) and secondary synchronization signal (SSS), and cell-specific reference signal. Transmit (TX) MIMO processor 230 may perform spatial processing (e.g., precoding) on the data symbols, the control symbols, or the reference symbols, if applicable, and may provide output symbol streams to modulators (MODs) 232a through 232t. For example, spatial processing performed on the data symbols, the control symbols, or the reference symbols may include precoding. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232a through 232t may be transmitted via antennas 234a through 234t, respectively.

At UE 115, antennas 252a through 252r may receive the downlink signals from base station 105 and may provide received signals to demodulators (DEMODs) 254a through 254r, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254a through 254r, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller 280, such as a processor.

On the uplink, at UE 115, transmit processor 264 may receive and process data (e.g., for a physical uplink shared channel (PUSCH)) from data source 262 and control information (e.g., for a physical uplink control channel (PUCCH)) from controller 280. Additionally, transmit processor 264 may also generate reference symbols for a reference signal. The symbols from transmit processor 264 may be precoded by TX MIMO processor 266 if applicable, further processed by modulators 254a through 254r (e.g., for SC-FDM, etc.), and transmitted to base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Receive processor 238 may provide the decoded data to data sink 239 and the decoded control information to controller 240.

Controllers 240 and 280 may direct the operation at base station 105 and UE 115, respectively. Controller 240 or other processors and modules at base station 105 or controller 280 or other processors and modules at UE 115 may perform or direct the execution of various processes within the devices and/or the wireless network. Memories 242 and 282 may store data and program codes for base station 105 and UE 115, respectively. Scheduler 244 may schedule UEs for data transmission on the downlink or the uplink.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen-before-talk or listen-before-transmitting (LBT) procedure such as a clear channel assessment (CCA) prior to communicating to determine whether the shared channel is available. In some implementations, a CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own back-off window based on the amount of energy detected on a channel or the acknowledge/negative-acknowledge (ACK/NACK) feedback for its own transmitted packets as a proxy for collisions.

While the description above refers to a UE 115 and base station 105, other configurations are possible. For example, the device 105 may be representative of a second UE, e.g., when two UEs are directly communicating without passing signals through a base station. In some such examples, the scheduler 244 is omitted. In other examples, the UE 115 may be representative of a second base station, e.g., when two base stations are communicating wirelessly over a backhaul. In some such examples, a scheduler is included in the device 115.

Separate hardware is conventionally used for processing mmWave signals or other large bandwidth RF signals and smaller bandwidth RF signals, such as 2G, 3G, 4G, or 5G sub-6 GHz RF signals. A receiver may be configured to be capable of processing different RF signals within one integrated circuit (IC) according to aspects of this disclosure. Such processing may be enabled by the use of a multi-stage (e.g., two or more stages) amplifier with inductor-less LNAs. The amplifier may include a fan-out stage that splits larger bandwidth RF signals into multiple smaller bandwidth RF signals that may be processed in parallel to obtain the information encoded in the signals. The circuitry for processing the smaller bandwidth RF signals may be re-used between large bandwidth and small bandwidth RF signals, including RF signals from different technologies (e.g., radio access technologies (RATs)). The re-use of processing circuitry may reduce complications in printed circuit board (PCB) design, may reduce die size, may reduce power consumption, and thus allow the design of smaller, more portable, longer lasting mobile devices. Additional functionality may be added to the amplifier through, for example, additional stages for higher frequency support or more carrier splits, multiple first-stage LNAs that can be used to switch between RF front-ends, and/or multiple first-stage LNAs that can be used for power combining from multiple RF front-ends.

Figure 3:
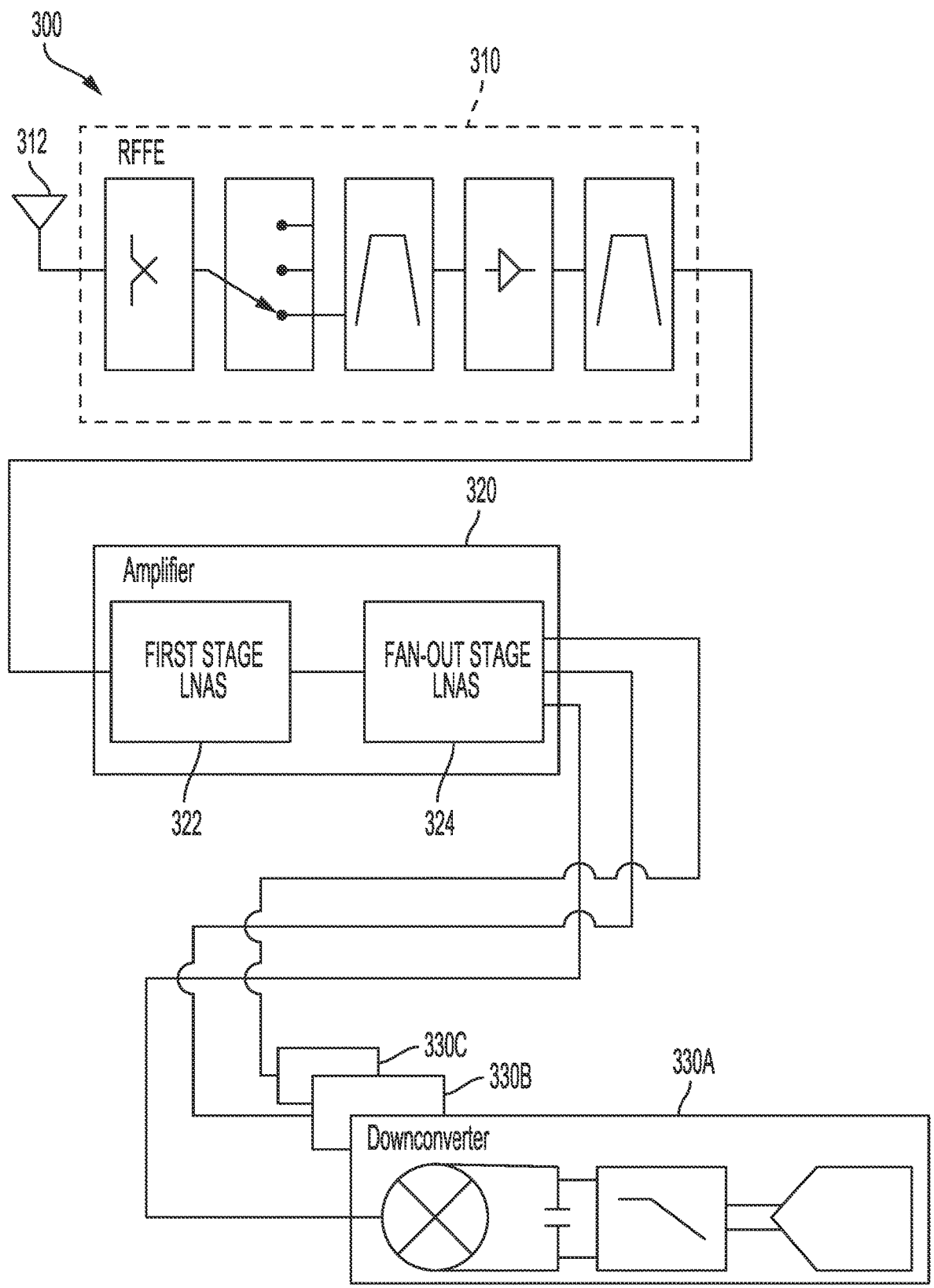
FIG. 3 is a block diagram illustrating portions of a device having an amplifier with inductor-less LNAs according to one or more aspects.

FIG. 3 is a block diagram illustrating portions of a device having an amplifier with improved LNA-designs according to one or more aspects. A receiver 300 of the device may include an antenna 312 to receive radio frequency (RF) signals. The antenna 312 is coupled to a RF front-end (RFFE) 310, which may include duplexers, filters, switches, and/or LNAs. The RFFE 310 is coupled to an amplifier 320. The amplifier 320 may have a lower total gain than a gain of the RFFE 310. The amplifier 320 is coupled to one or more downconverters 330A, 330B, and 330C. Each of the downconverters may include mixers, baseband filters (BBFs), and/or analog-to-digital converters (ADCs). The amplifier 320 may include a first stage 322 and a fan-out stage 324. In some aspects, each of the stages 322 and 324 may include inductor-less LNAs and/or inverter-based LNAs, respectively, which may contribute to a reduced die size and reduced costs of an integrated circuit (IC) containing the amplifier 320. In some examples, the amplifier 320 is shared on an IC with one or more of the RFFE 310 and/or the downconverters 330A, 330B, and 330C. In other examples, the amplifier 320 is implemented on an IC or chip separate from the RFFE 310. For example, the chip or IC on which the amplifier 320 is disposed may be coupled to a component in the RFFE 310 by an interconnect, for example by a trace on a circuit board, a wire or cable such as a coaxial cable or flexible cable, a flexible printed circuit board, etc. One or more modules (for example, configured for one or more technologies) may be included in the RFFE 310 and coupled to the amplifier 320.

Matching inductors are conventionally used to obtain input matching in the amplifier 320 to the RFFE 310. These inductors may increase costs, and die area, e.g., due to the need for external components, or the need for additional package layers, as well creating isolation concerns. The impedance matching challenges may be further complicated by carrier aggregation (CA) operation. Carrier aggregation (CA) involves the combination of one or more carrier RF signals to carry a single data stream. Carrier aggregation (CA) improves the flexibility of the wireless devices and improves network utilization by allowing devices to be assigned different numbers of carriers for different periods of time based, at least in part, on historical, instantaneous, and/or predicted bandwidth use by the wireless device. Thus, when a mobile device needs additional bandwidth, additional carriers may be assigned to that wireless device, and then de-assigned and re-assigned to other mobile devices when bandwidth demands change. As carriers are assigned and de-assigned from a mobile device, the receiver circuitry associated with those carriers may be deactivated, resulting in a change in the configuration of the circuitry, which results in a load change at the output of the RFFE 310. In examples of the amplifier 320, when a carrier is deactivated for a mobile device, an active portion of LNAs corresponding to the deactivated carrier within the amplifier 320 may be deactivated and a feedback element of that LNA is reconfigured to act as a shunt dummy load to improve impedance matching, which may be performed without an inductor in the amplifier 320.

The configuration of first stage 322 and fan-out stage 324 in amplifier 320 as a multi-stage LNA matrix may allow the operation of the amplifier stage 320 and impedance matching within the amplifier 320 without inductors. The first stage 322 may include one or more gyrator LNAs (gLNAs). The gLNAs may be common to all carrier's frequency bands and configured to provide a matchless interface to the RFFE 310. The fan-out stage 324 may include one or more LNAs organized into one or more of a second stage, third stage, fourth stage, fifth stage, or more generally an N-th stage after the first stage 322. The fan-out stage 324 may provide additional gain and facilitate multi-carrier splitting. The fan-out stage 324 may also provide a predictable interface for the gLNAs of the first stage 322, which may allow a total gain of the amplifier 320 to be tuned without significantly affecting impedance matching of the amplifier 320. Although the first-stage LNAs 322 and fan-out LNAs 324 are described in some examples as inductor-less LNAs, aspects of the invention may include amplifier arrangements as shown in FIG. 3 and subsequent figures with other LNA configurations, including LNAs with degeneration inductors, inverter-based LNAs, and/or combinations of LNAs. The fan-out stage 324 may include a stage which has more amplifiers than an immediately previous stage. In some examples, each stage of the fan-out stage 324 includes more amplifiers than an immediately previous stage.

Figure 4:
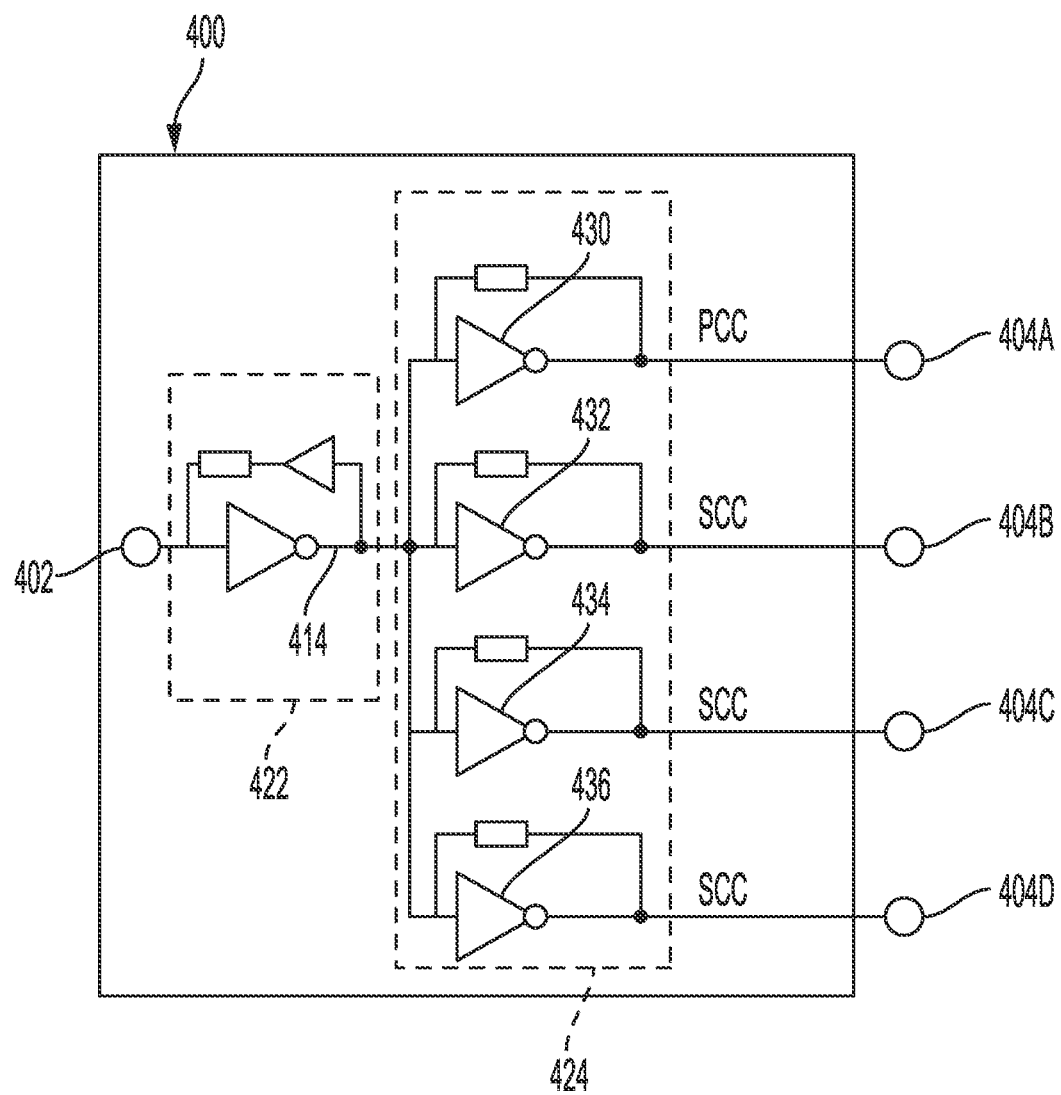
FIG. 4 is a circuit schematic illustrating a two-stage fan-out amplifier with inductor-less LNAs according to one or more aspects.

The amplifier 320 may include two or more stages to provide desired gain and/or carrier split capabilities. One example of a two-stage amplifier 320 is shown in FIG. 4. FIG. 4 is a circuit schematic illustrating a two-stage fan-out amplifier with inductor-less LNAs according to one or more aspects. A two-stage amplifier 400 includes a first stage 422 and a fan-out stage 424. The amplifier 400 is connected to an input node 402, which may be coupled to a RF antenna or other circuitry of a RFFE, for example through a chip or IC input. An input signal is input at the input node 402 of the amplifier 400 for amplification and/or splitting. The amplifier 400 may include a plurality of amplifier output nodes 404A, 404B, 404C, and 404D, which output the amplified and/or split RF signals.

The first stage 422 includes (e.g., common) gain elements for amplifying signals prior to the fan-out stage 424. In the example of FIG. 4, the first stage 422 includes one inductor-less LNA. The first-stage LNA may be a gyrator LNA (gLNA) having a first (e.g., operational or inverter) amplifier configured with a feedback loop including an operational amplifier and/or impedance element connected in series. The first stage 422 is coupled to the input node 402 and configured to amplify input signals input at the input node 402 for output at the at least one first stage output node 414. In some examples, one or more amplifiers (e.g., the inductor-less LNA) in the first stage 422 are coupled to input node 402 by a respective switch (not illustrated). A switch may decouple the one or more amplifiers from the input node 402 to reduce the power consumption of the two-stage amplifier 420 in a deactivated or sleep state. In other examples, one or more amplifiers (e.g., of the inductor-less LNA) in the first stage 422 are coupled to the at least one first stage output node 414 by a respective switch (not illustrated). A switch may decouple the one or more amplifiers in the first stage 422 from the at least one first stage output node 414 to control which one of the one or more first state output node 414 is to output the amplified input signals.

The fan-out stage 424 includes inductor-less LNAs to provide additional gain and splitting of the signal output from the first stage 422. The fan-out stage is coupled to the at least one first stage output node 414 and to the plurality of amplifier output nodes 404A, 404B, 404C, and 404D. The fan-out stage 424 in a two-stage amplifier may include a plurality of inductor-less LNAs coupled to a common input at the first stage output node 414 and coupled separately to the plurality of amplifier output nodes 404A, 404B, 404C, and 404D. The fan-out stage 424 is configured to amplify signals at the at least one first stage output node 414 for output at the plurality of amplifier output nodes 404A, 404B, 404C, and 404D. In some examples, one or more amplifiers (e.g., the inductor-less LNAs) in the fan-out stage 424 are coupled to the common input at the first stage output node 414 by a respective switch (not illustrated). A switch which may decouple the one or more amplifiers in the fan-out stage 424 from the at least one first stage output node 414 further controls which one of the plurality of amplifier output nodes 404A, 404B, 404C, and 404D is to output the amplified input signals. In other examples, one or more amplifiers in the fan-out stage 422 are coupled to plurality of amplifier output nodes 404A, 404B, 404C, and 404D by a respective switch (not illustrated). A switch which may decouple the one or more amplifiers from the plurality of amplifier output nodes 404A, 404B, 404C, and 404D allows reducing the power consumption of the two-stage amplifier 420 when resuming normal operation after the deactivated or sleep state. The example of FIG. 4 includes four inductor-less LNAs, which may be configured to split an RF signal into a primary component carrier (PCC), a first secondary component carrier (SCC), a second SCC, and a third SCC at amplifier output nodes 404A, 404B, 404C, and 404D. However, other examples of a two-stage amplifier may include different numbers of inductor-less LNAs to accommodate more or less component carriers.

The LNAs of the two-stage amplifier 400 may be configured to pass some or all frequency bands of carriers through to the various output nodes. For example, in some aspects the LNAs 430, 432, 434, 436, and in the first stage 422 may be wide-band LNAs that pass frequency bands of all carriers through to all output nodes where the signals at each output node may be processed to extract a desired carrier for further processing, such as for downconversion. In other aspects, one or more of the LNAs 430, 432, 434, 436, and in the first stage 422 may be narrow-band LNAs that pass only a subset of frequency bands of a signal input at the input node to the LNA's respective output node. For example, a narrow-band LNA for LNA 430 may result in only frequency bands of the PCC carrier reaching the output node 404A. In some aspects, one or more of the LNAs 430, 432, 434, 436, and in the first stage 422 may include RF (notch) filters to remove or reduce signal strength of undesired frequency bands of carriers from a particular path through the two-stage amplifier 400.

The LNAs of the two-stage amplifier 400 may have separate bias signals or one or more of the LNAs may share a bias signal. For example, the LNAs 430, 432, 434, and 436 may share a bias signal, with a separate bias signal applied to the LNA in the first-stage 422. As another example, the LNAs 432, 434, and 436 may share a bias signal, with other bias signals applied to the LNA in the first stage 422 and the LNA 430. As a further example, bias signal circuitry may be shared by the LNAs 430, 432, 434, 436, but with a closed-loop bias applied to the LNA 430 corresponding to the PCC signal and with a replica bias applied to the LNAs 432, 434, and 436 corresponding to the SCC signals.

Figure 5:
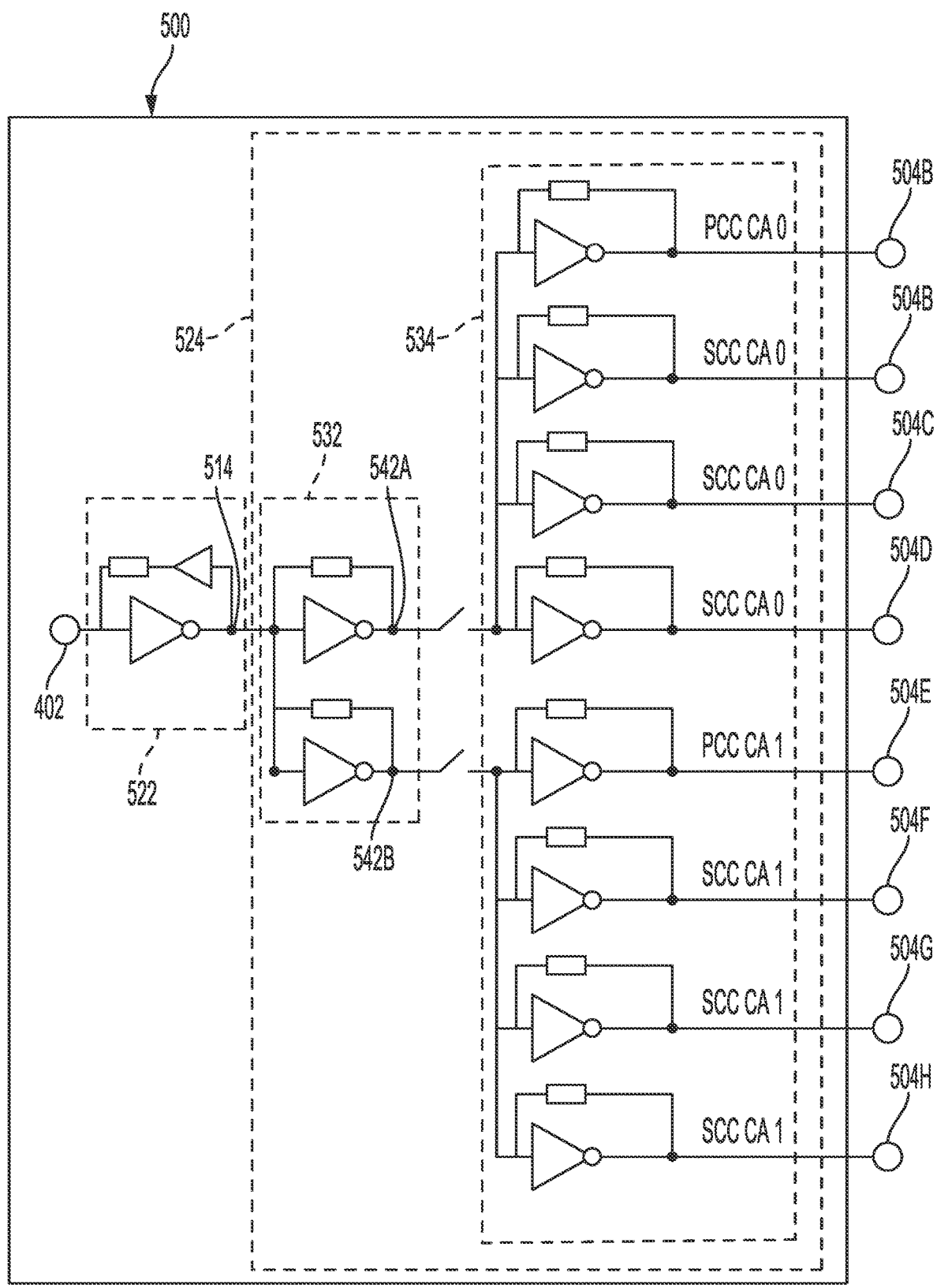
FIG. 5 is a circuit schematic illustrating a three-stage fan-out amplifier with inductor-less LNAs according to one or more aspects.

Referring back to FIG. 3, the amplifier 320 may include more stages than the two stages of the example of FIG. 4. For example, the amplifier 320 may be a three-stage amplifier with two stages of inductor-less LNAs in the fan-out stage 324. One example of a three-stage amplifier is shown in FIG. 5. FIG. 5 is a circuit schematic illustrating a three-stage fan-out amplifier with inductor-less LNAs according to one or more aspects. An amplifier 500 may include a first stage 522 including at least one inductor-less LNA, such as a gLNA. In some examples, the at least one inductor-less LNA in the first stage 522 is coupled to input node 402 by a respective switch (not illustrated). In other examples, the at least one inductor-less LNA in the first stage 522 is coupled to the at least one first stage output node 514 by a respective switch (not illustrated). A fan-out stage 524 is coupled to input the output of the first stage 522 and provide further amplification and/or carrier splitting on the output of the first stage 522. In three-stage amplifier 500, the fan-out stage 524 may include two stages: a second stage 532 and a third stage 534. The second stage 532 may include inductor-less LNAs coupled to a common input at first stage output node 514 and configured to output separate signals to a plurality of second stage output nodes 542A and 542B. In some examples, each of the inductor-less LNAs in the second stage 532 are coupled to the common input at first stage output node 514 by a respective switch (not illustrated). The third stage 534 may include sets of inductor-less LNAs, with each set coupled to a common input, such as either of the second stage output nodes 542A and 542B, and configured to output separate signals to a plurality of amplifier output nodes 504A, 504B, 504C, 504D, 504E, 504F, 504G, and 504H. Each set of inductor-less LNAs in the second stage 532 may be coupled to an output node of the second stage 532 by a respective switch. In some examples, each LNA in one or both of the sets in the third stage 534 may be coupled to an output node of the second stage by a respective switch (not illustrated). In other examples, each LNA in the third stage 534 is coupled to plurality of amplifier output nodes 504A, 504B, 504C, 504D, 504E, 504F, 504G, and 504H by a respective switch (not illustrated).

The three-stage amplifier 500 may be used to provide signals to downconversion circuitry for separate processing of a subset of frequency bands of carriers at each of the amplifier output nodes 504A, 504B, 504C, 504D, 504E, 504F, 504G, and 504H. In some examples, the second stage 532 may perform inter-band splitting of a plurality of frequency bands of carriers in the input signal received at input node 402. For example, the output of the second stage 532 may include a first set of carriers in a first frequency band at a first second-stage output node 542A and a second set of carriers in a second frequency band at a second second-stage output node 542B. The configuration illustrated in FIG. 5 of a fan-out stage 524 with a second stage of two inductor-less LNAs and a third stage of eight inductor-less LNAs provides eight amplifier output nodes, which may correspond to frequency bands of carriers PCC (Primary Component Carrier) CA0, first SCC (Secondary Component Carrier) CA0, second SCC CA0, third SCC CA0, PCC CA1, first SCC CA1, second SCC CA1, and third SCC CA1 PCC and SCC may refer to intra-band carrier aggregation (CA) carriers, and CA0 and CA1 may refer to inter-band CA carriers.

Figure 6:
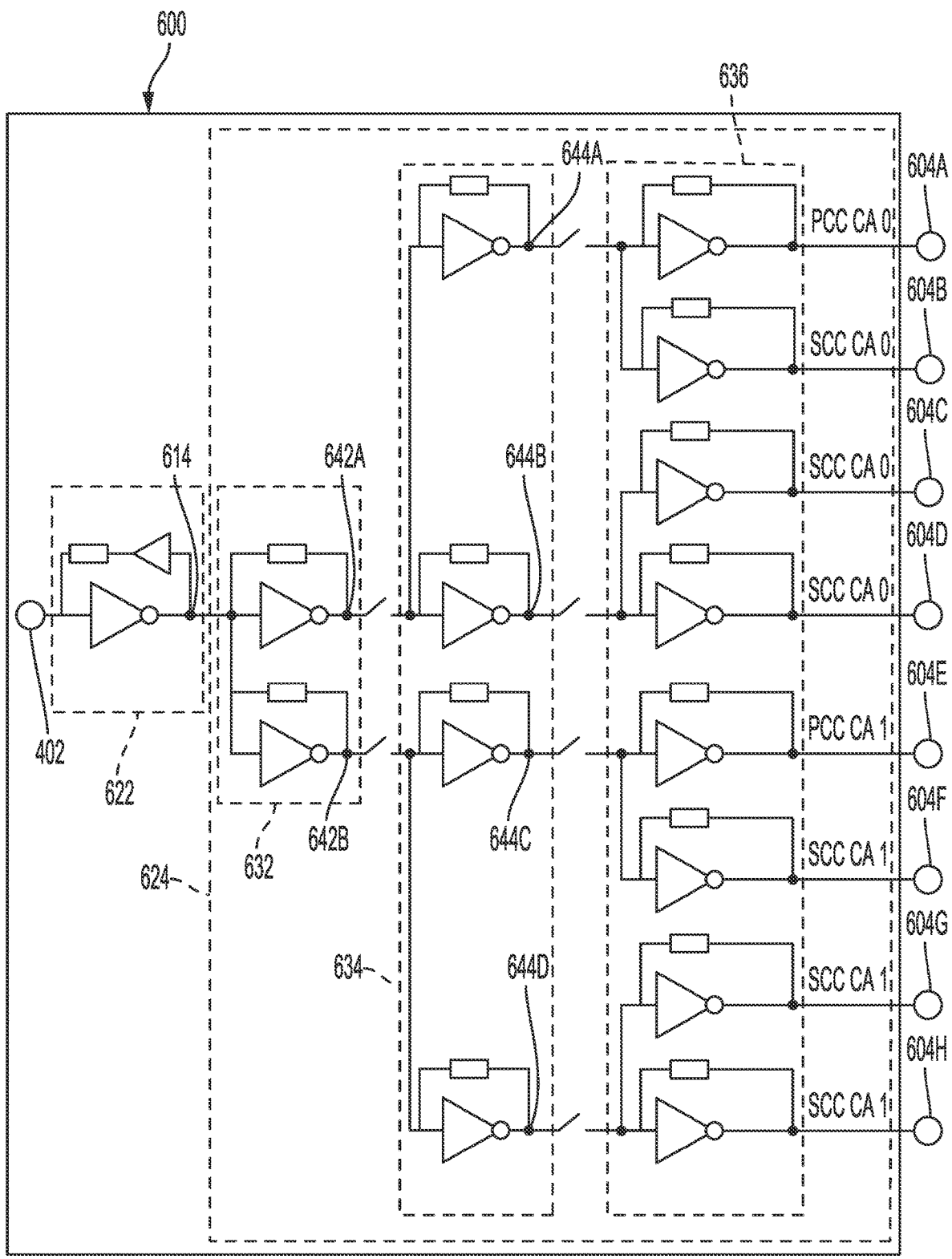
FIG. 6 is a circuit schematic illustrating a four-stage fan-out amplifier with inductor-less LNAs according to one or more aspects.

Referring back to FIG. 3, the amplifier 320 may include more stages than the examples of FIG. 4 and FIG. 5. For example, the amplifier 320 may be a four-stage amplifier with three stages of inductor-less LNAs in the fan-out stage 324. One example of a four-stage amplifier is shown in FIG. 6. FIG. 6 is a circuit schematic illustrating a four-stage fan-out amplifier with inductor-less LNAs according to one or more aspects. An amplifier 600 may include a first stage 622 including at least one inductor-less LNA, such as a gLNA. In some examples, the at least one inductor-less LNA in the first stage 622 is coupled to input node 402 by a respective switch (not illustrated). In other examples, the at least one inductor-less LNA in the first stage 622 is coupled to at least one first stage output node 614 by a respective switch (not illustrated). A fan-out stage 624 is coupled to receive the output of the first stage 622 and provide further amplification and/or carrier splitting on the output of the first stage 622. In four-stage amplifier 600, the fan-out stage 624 may include three stages: a second stage 632, a third stage 634, and a fourth stage 636. The second stage 632 may include inductor-less LNAs coupled at a common input, the first stage output node 614, and configured to output signals to a plurality of second stage output nodes 642A and 642B.

In some examples, each of the inductor-less LNAs in the second stage 632 is coupled to the common input, the first stage output node 614, by a respective switch (not illustrated). The third stage 634 may include sets of inductor-less LNAs with each LNA of the set coupled to a common input, the second stage output nodes 642A or 642B, and configured to output signals to third stage output nodes 644A, 644B, 644C, and 644D. In other examples, each set of inductor-less LNA of the third stage 634 is coupled to a common input, the second stage output nodes 642A or 642B, by a respective switch (not illustrated). The fourth stage 636 may include sets of inductor-less LNAs, each set coupled to a common input at one of the third stage output nodes 644A, 644B, 644C, or 644D, and configured to output signals to the amplifier output nodes 604A, 604B, 604C, 604D, 604E, 604F, 604G, and 604H. In further examples, each set of inductor-less LNA of the fourth stage 636 is coupled to a common input, the third stage output nodes 644A, 644B, 644C, or 644D, by a respective switch (not illustrated). Accordingly, each set of inductor-less LNAs in a stage of the fan-out stage 624 may be coupled to an output node of a previous stage by a respective switch, and/or each LNA in one or more sets in the fan-out stage 624 may be coupled to an output node of a previous stage by a respective switch (not illustrated). In some examples, each set of LNAs in the fourth stage 636 is coupled to plurality of amplifier output nodes 604A, 604B, 604C, 604D, 604E, 604F, 604G, and 604H by a respective switch (not illustrated).

The four-stage amplifier 600 may be used to provide signals to downconversion circuitry for separate processing of a subset of frequency bands of carriers at each of the amplifier output nodes 604A, 604B, 604C, 604D, 604E, 604F, 604G, and 604H. In some examples, the second stage 632 may perform inter-band splitting of a plurality of carriers in the input signal received at input node 402. For example, the output of the second stage 632 may include a first set of carriers in a first frequency band at the first second-stage output node 642A and a second set of carriers in a second frequency band at the second second-stage output node 642B. The third stage 634 may be organized with a first set of inductor-less LNAs coupled to a common input at the first second-stage output node 642A and a second set of inductor-less LNAs coupled to a common input at the second second-stage output node 642B. The fourth stage 636 may be organized with a first, second, third, and fourth sets of inductor-less LNAs, each set of LNAs coupled to a common input at one of the third-stage output nodes 644A, 644B, 644C, or 644D. The configuration illustrated in FIG. 6 of a fan-out stage 624 with a second stage of two inductor-less LNAs, a third stage of four inductor-less LNAs and a fourth stage of eight inductor-less LNAs provides eight amplifier output nodes, which may correspond to frequency bands of carriers PCC CA0, first SCC CA0, second SCC CA0, third SCC CA0, PCC CA1, first SCC CA1, second SCC CA1, and third SCC CA1.

Figure 7:
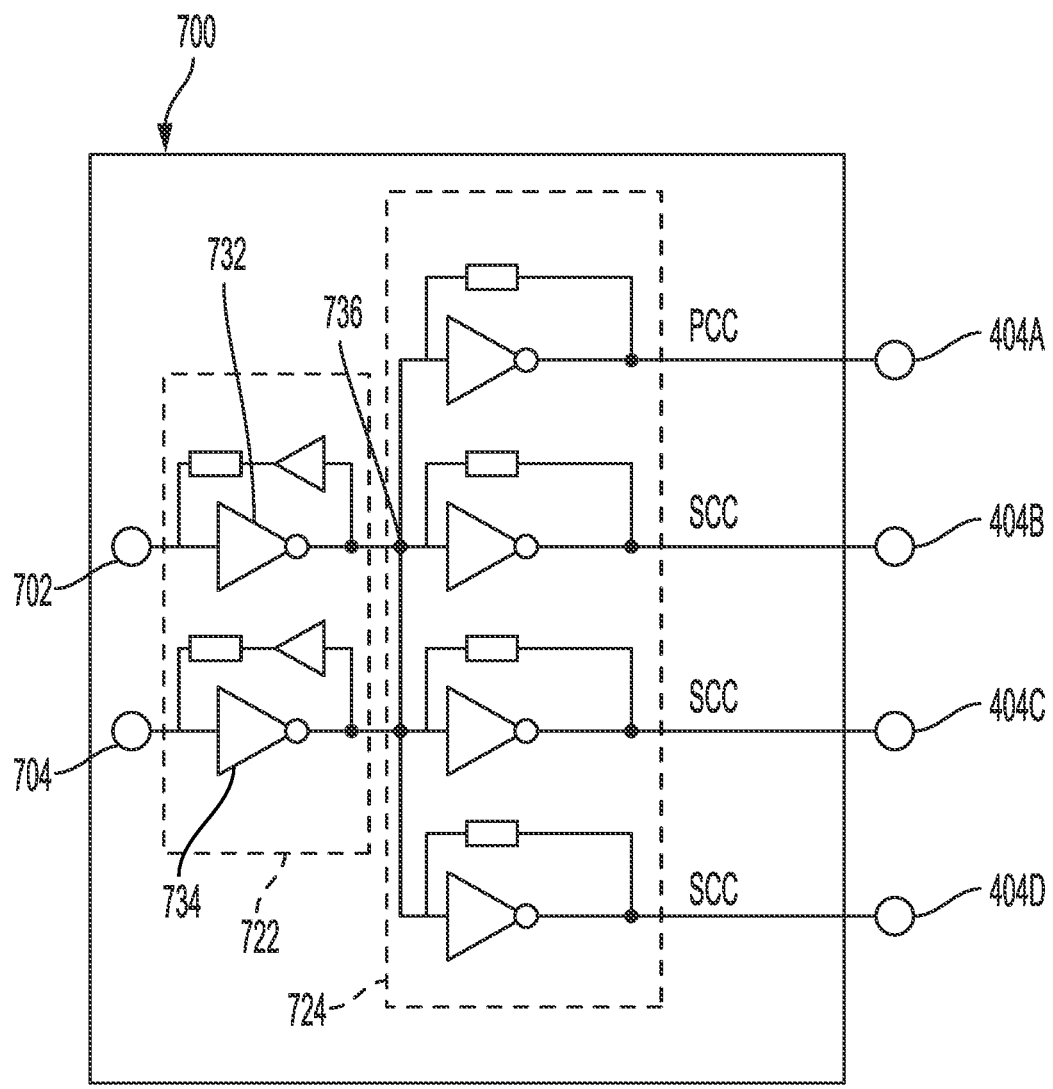
FIG. 7 is a circuit schematic illustrating a two-stage fan-out amplifier with inductor-less LNAs with power combining in the first stage according to one or more aspects.

Referring back to FIG. 3, the two-stage amplifier 320 may include more than one inductor-less LNA in the first stage 322. For example, the amplifier 320 may include two, three, four, or more LNAs configured to provide power combining that may achieve a higher gain than a single LNA or that may achieve higher gain based on input from multiple antenna input ports. One example of a power-combining first stage is shown in FIG. 7. FIG. 7 is a circuit schematic illustrating a two-stage fan-out amplifier with inductor-less LNAs with power combining in the first stage according to one or more aspects. An amplifier 700 includes a first stage 722 with inductor-less LNAs 732 and 734 coupled to separate input nodes 702 and 704, which may lead to different RFFEs and/or different antennas. In some examples, the two inductor-less LNAs 732 and 734 in the first stage 722 are coupled to separate input nodes 702 and 704 by a respective switch (not illustrated). One or both of the LNAs 732 and 734 may be gLNAs. The two LNAs 732 and 734 may be coupled at a common first stage output node 736, to which the first stage 722 is coupled to a fan-out stage 724. In some examples, the LNAs 732 and 734 may be coupled in parallel by having the inputs of the LNAs 732 and 734 coupled to the same input node. In other examples, the two LNAs 732 and 734 may be coupled to the at least one first stage output node 514 by a respective switch (not illustrated). Although the fan-out stage 724 is shown as a single stage in the example of FIG. 7, other fan-out stage 724 configurations may be used with the power-combining first stage 722. For example, the fan-out stage 724 may use any of the configurations of FIG. 4, FIG. 5, or FIG. 6.

The outputs of the first stage 722 may be combined in any number of ways, using any number of components or circuits. For example, outputs of the first stage may be coupled to a current combiner, power combiner, etc. In the configuration illustrated in FIG. 7, the outputs of the first stage 722 are directly connected at a node, e.g., the common first stage output port node 736. In other configurations, one or more additional components may be configured to combine outputs of the first stage 722 and provide the combined output to the common first stage output node 736. In some examples, one or more amplifiers in the fan-out stage 724 are coupled to the common first stage output node 736 by a respective switch (not illustrated). In situations in which power combining is not desired, one or more of the LNAs (and/or the combining components/circuitry described in this paragraph) may be selectively activate or deactivated using a power combining control signal (e.g., from the controller 280). In further examples, the one or more amplifiers in the fan-out stage 724 are coupled to plurality of amplifier output nodes 404A, 404B, 404C, and 404D by a respective switch (not illustrated).

Multi-stage amplifiers with a fan-out stage, such as the amplifier stages described and illustrated herein, may be configured to allow a receiver circuit to support multiple bandwidths using shared downconversion circuitry. For example, a single integrated circuit (IC) chip may be constructed to support amplification and downconversion of 5G sub-6 GHz RF signals, which may have a smaller bandwidth, and larger bandwidth mmWave RF signals. In this description, the term mmWave RF signals may include signals derived from a mmWave signal received at an antenna. For example, mmWave RF signals may include signals having an IF frequency, for example that were downconverted from a frequency at which the mmWave RF signals were received at an antenna. An IC/chip described as being configured to process or support mmWave RF signals may therefore be configured to process such signals at a frequency other than the frequency at which mmWave signals were received at the antenna. One example circuit with a fan-out amplifier configured to share downconversion circuitry is shown in FIG. 8A, and operation of the receiver to share downconversion circuitry is explained with reference to FIG. 8B, FIG. 8C, and FIG. 8D.

Figure 8A:
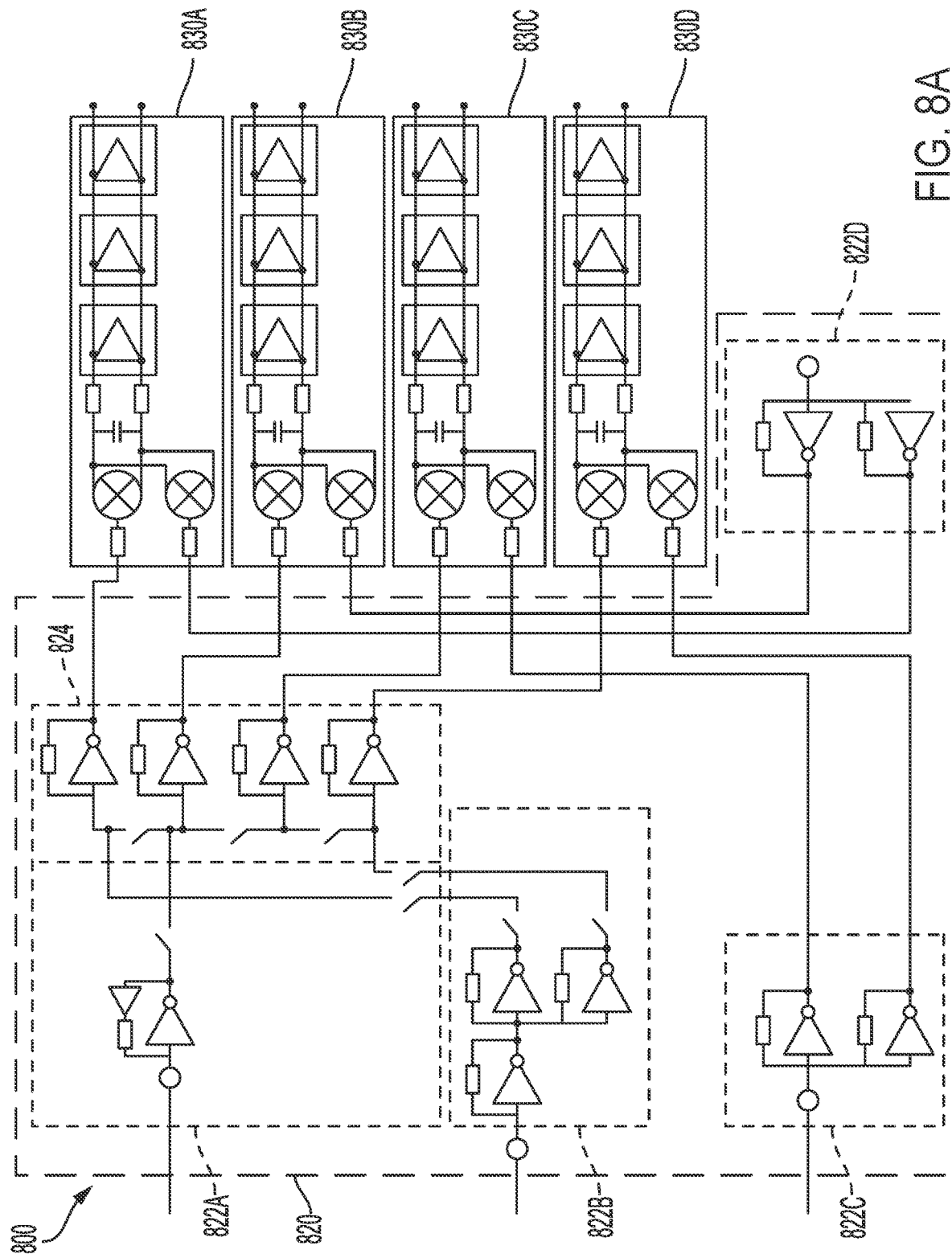
FIG. 8A is a circuit schematic illustrating a configuration for processing a large bandwidth signal with a fan-out amplifier and a plurality of mixer circuits configured to process portions of the large bandwidth signal according to one or more aspects.

FIG. 8A is a circuit schematic illustrating a configuration for processing a large bandwidth signal with a fan-out amplifier and a plurality of mixer circuits configured to process portions of the large bandwidth signal according to one or more aspects. A receiver circuit 800 may include an amplifier 820. The amplifier 820 may include multiple first stages 822A, 822B, 822C, and 822D configured for different RF signal input nodes. For example, first stage 822A may be configured with a gLNA for amplifying 5G sub-6 GHz RF signals, first stage 822B may be configured with inductor-less LNAs for amplifying 5G mmWave RF signals, first stage 822C may be configured with inductor-less LNAs for amplifying 2G/3G/4G/5G (sub-6) RF signals received on a first antenna, and first stage 822D may be configured with inductor-less LNAs for amplifying 2G/3G/4G/5G (sub-6) RF signals received on a second antenna. For example, the first stage 822A may be coupled to an antenna (e.g., a first antenna 312) configured to receive 5G sub-6 GHz RF signals through a first RFFE 310; similarly, the first stage 822B may be coupled to an antenna (e.g., a second antenna 312) configured to receive 5G mmWave RF signals through a second RFFE 310 The first stages 822A and 822B may be coupled to fan-out stage 824 through switches that allow the first stages 822A and 822B to share the fan-out stage 824. Outputs from the fan-out stage 824 may couple to downconverters 830A, 830B, 830C, and 830D, which allow the downconverters to be re-used for different RF signals, such as for 5G mmWave RF signal processing and 5G sub-6 GHz RF signal processing. The 5G mmWave RF signal processing is performed by splitting the larger bandwidth of the mmWave RF signal into smaller pieces for separate downconversion in downconverters 830A, 830B, 830C, and 830D. In some examples, the downconverters 830A, 830B, 830C, and 830D may be configured to operate on bandwidths corresponding to frequency bands of carriers within the 5G sub-6 GHz RF signals. The first stages 822C and 822D may also be coupled to the downconverters 830A, 830B, 830C, and 830D to facilitate re-use of the downconversion circuits for 2G/3G/4G/5G (sub-6) RF signals. In some examples, one or more of the first stages 822 are coupled to an antenna configured to receive signals having an FR3 frequency. The downconverters 830 may be implemented on the same IC/chip as the first stages 822.

Figure 8B:
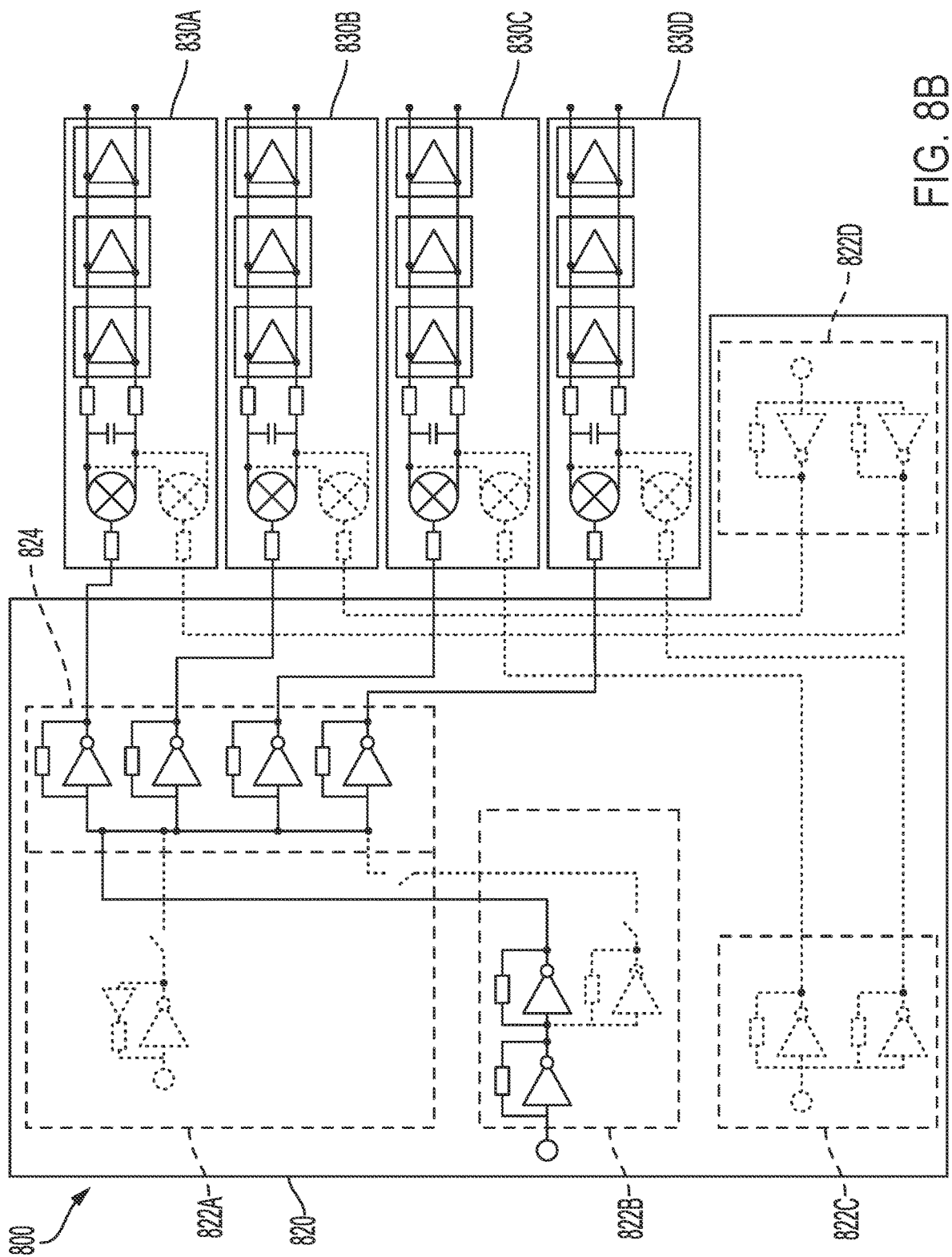
FIGS. 8B-8D are circuit schematics illustrating various operating configurations for the fan-out amplifier of FIG. 8A according to one or more aspects.
Figure 8C:
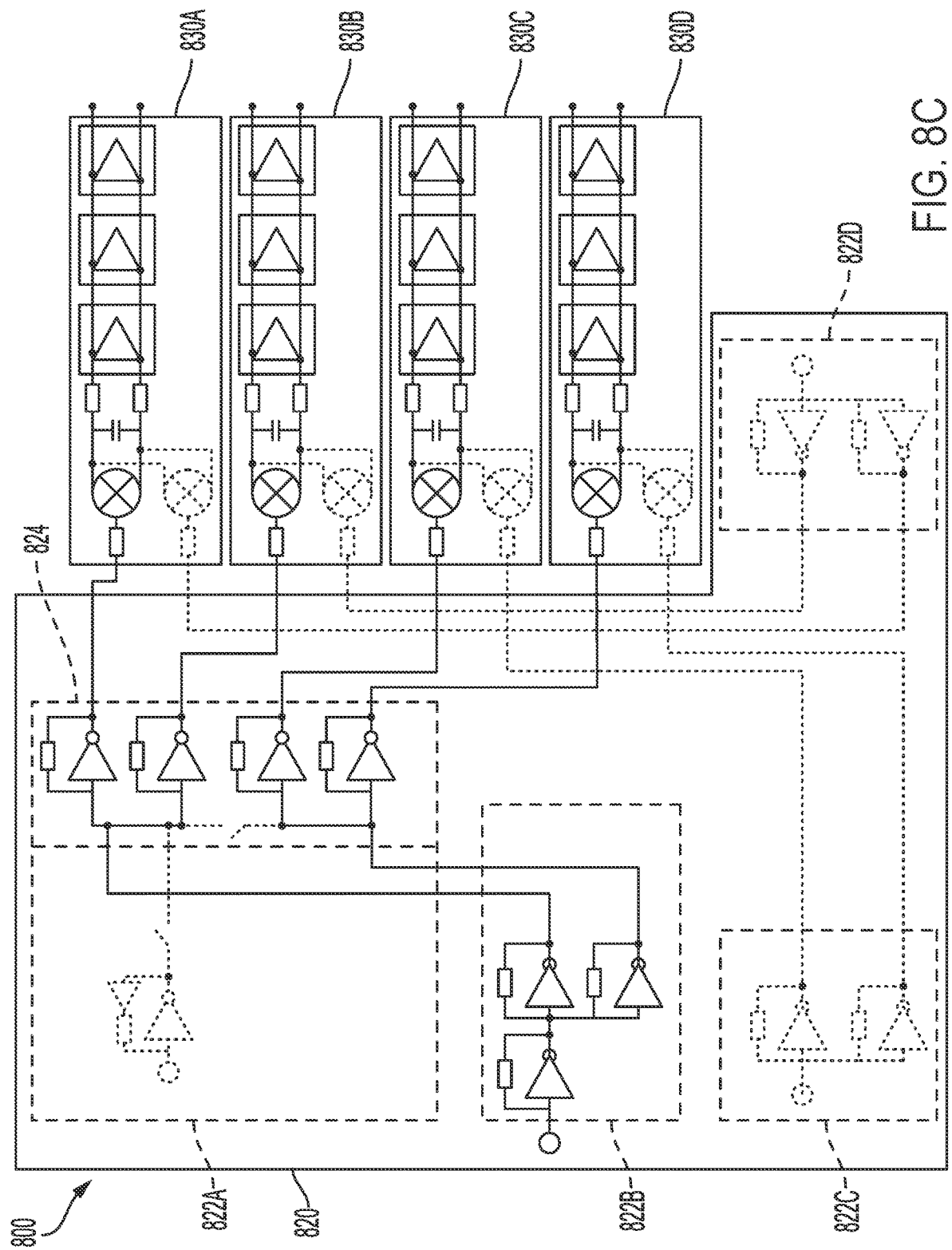
Figure 8D:
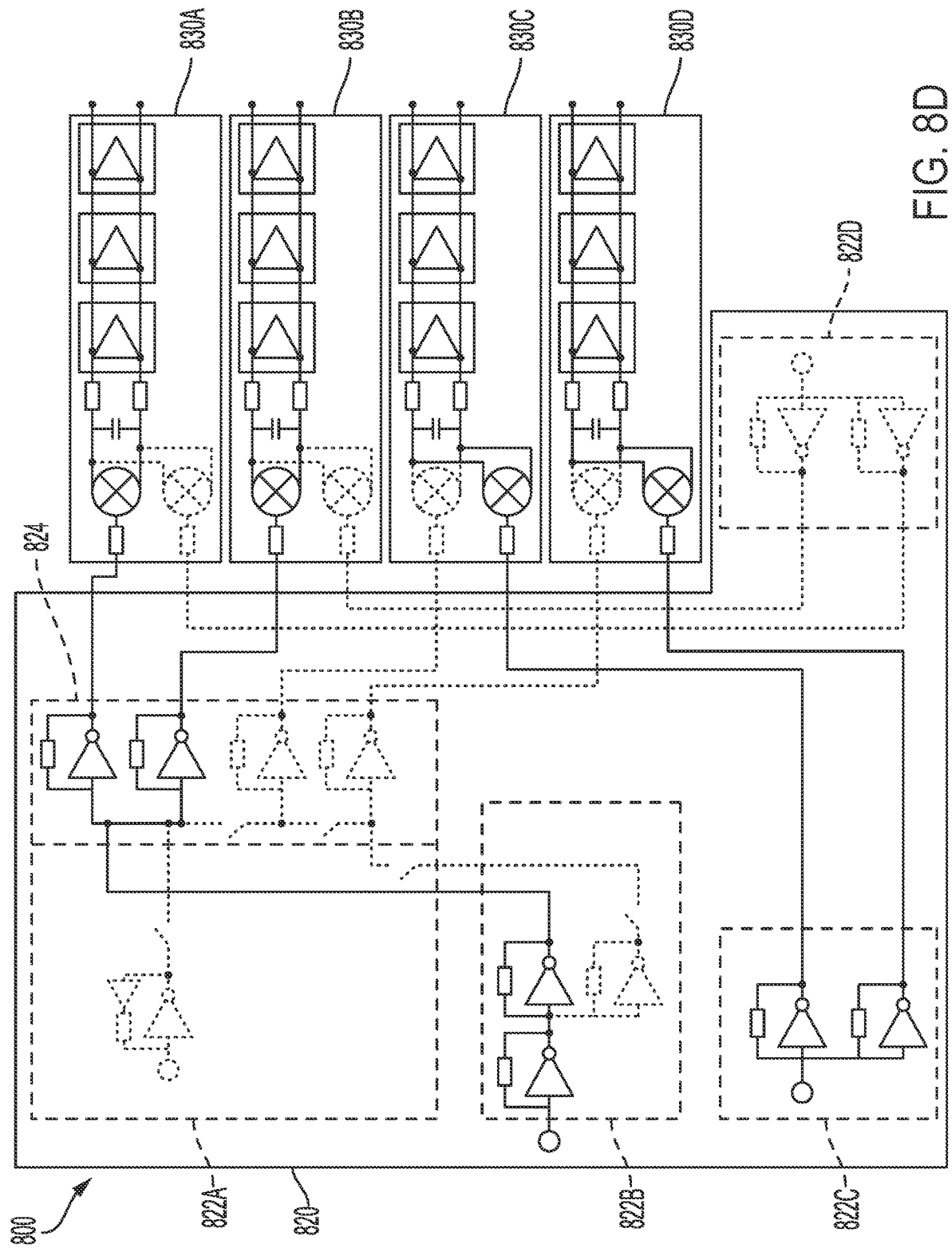

Certain operations of the receiver circuit of FIG. 8A to share downconversion circuits 830A, 830B, 830C, and 830D is illustrated in the circuits of FIGS. 8B-8D. 5G mmWave RF signals may be processed in the receiver circuit of FIG. 8A as shown in FIG. 8B. A portion of first stage 822B is activated to provide amplification of a 5G mmWave RF signal received at one or more antennas. The output of the first stage 822B is coupled through switches to fan-out stage 824. The fan-out stage 824 includes four inductor-less LNAs coupled to the output of the first stage 822B, and the four LNAs provide the 5G mmWave RF signal to the four downconverters 830A, 830B, 830C, and 830D. The downconverters 830A, 830B, 830C, and 830D process different portions of the bandwidth of the 5G mmWave RF signal. The processed portions may be recombined in digital logic circuitry coupled to the output of downconverters 830A, 830B, 830C, and 830D. In some examples, the digital logic circuitry is included in a modem or processor separate from the IC/chip on which the downconverters 830 are implemented. In some examples, a portion of the digital logic circuitry is included on the IC/chip. Unused first stages 822A, 822C, and 822D may be deactivated to reduce power consumption in the receiver circuit 800.

In some examples, switches in the path from the first stage 822B to the fan-out stage 824 may be reconfigured to couple parallel output paths of the first stage 822B to different parallel LNAs within fan-out stage 824, as shown in FIG. 8C. For example, one parallel output path may couple a first LNA of the first stage 822B to at least two LNAs of fan-out stage 824, which are each coupled to downconverters 830A and 830B, respectively. Another parallel output path may couple a second LNA of the first stage 822B to at least two LNAs of the fan-out stage 824 different from those coupled to the first LNA of the first stage 822B, the two LNAs coupled to downconverters 820C and 830D, respectively.

In some examples (not illustrated), any of the first stages 822 may include multiple input nodes (with a respective LNA coupled to each input node), e.g., such that power-combining may be achieved, as described with respect to FIG. 7. In one such example (not illustrated), the first stage 822B includes an (intermediate) input node in addition to the input node illustrated in FIG. 8. The additional (intermediate) input node is connected to the input of a lower (downstream) LNA in the first stage 822B or through an additional (upstream) LNA connected between the input node and the input of the lower (downstream) LNA. In such example, power combining may be achieved in the first stage by activating all of the LNAs of first stage 822B and providing outputs thereof to the fan-out stage 824, e.g., to improve signal processing in certain environmental conditions. In such example, the switch between the first set of two LNAs in fan-out stage 824 and the second set of two LNAs in fan-out stage 824 may be closed (in contrast to the example illustrated in FIG. 8C).

The downconverters 830A, 830B, 830C, and 830D may be used for processing 2G/3G/4G/5G (sub-6) RF signals received at an antenna and amplified in other stages simultaneous with the output of the fan-out stage 824. For example, some of the downconverters 830A, 830B, 830C, and 830D may be reconfigured to couple to the first stage 822C as shown in FIG. 8D. For example, downconverters 830A and 830B may be coupled to process 5G mmWave RF signals amplified by a portion of the first stage 822B and a portion of the fan-out stage 824, and downconverters 830C and 830D may be coupled to process 2G/3G/4G/5G (sub-6) RF signals amplified by the first stage 822C. In this configuration, the receiver circuit 800 shares downconverters between RF signals allowing the circuit 800 to operate on multiple RF signals or perform carrier aggregation (CA) across multiple RF signals. This reduces chip size and/or power consumption by not having different downconversion circuitry for each of the RF signals and first stages 822A, 822B, 822C, and 822D.

The receiver circuit 800 may be configured and/or operated to receive and/or process signals or combinations of signals other than those explicitly described above. For example, the first stage 822A and a portion (e.g., subset of LNAs) of the fan-out stage 824 may be configured to amplify a 5G sub-6 GHz signal(s) and route it to an appropriate downconverter(s) 830 concurrent with the first stage 822B and another portion of the fan-out stage 842 amplifying and routing 5G mmWave signals to other downconverters 830. In some examples, one or more 5G sub-6 GHz signals may be amplified by the first stage 822A in the absence of signals from other technologies (e.g., 2G, 3G, 4G) or frequency bands (e.g., mmWave). In such examples, the fan-out stage 824 may be used to route the signals to an appropriate downconverter(s) 830, and/or to route carriers for carrier aggregation. Another example may include the first stage 822A and a portion (e.g., subset of LNAs) of the fan-out stage 824 amplifying a 5G sub-6 GHz signal(s) and routing it to an appropriate downconverter(s) 830 concurrent with the first stage 822C and/or 822D amplifying and routing legacy (e.g., 2G, 3G, and/or 4G) signals to other downconverters 830. Yet another example includes just the amplification and downconversion of legacy signals using only the first stage 822C and/or 822D and an appropriate downconverter(s) 830. Amplification, downconversion, and/or other processing of other signals (e.g., WiFi, Bluetooth, etc.) or combinations not described herein may be performed by the receiver circuit 800.

As alluded to above, each of the downconverters 830 may include a baseband filter (BBF). The BBF may be configured to process signals having a bandwidth which is typically associated with a 5G sub-6 GHz signal. In some examples, one or more (or all) of the BBFs are configured similarly. For example, two BBFs may include similar components, and the arrangement of the components with respect to each other may be similar in each of the two BBFs. In some such examples, the values or sizes of certain of the components vary between BBFs.

Figure 9:
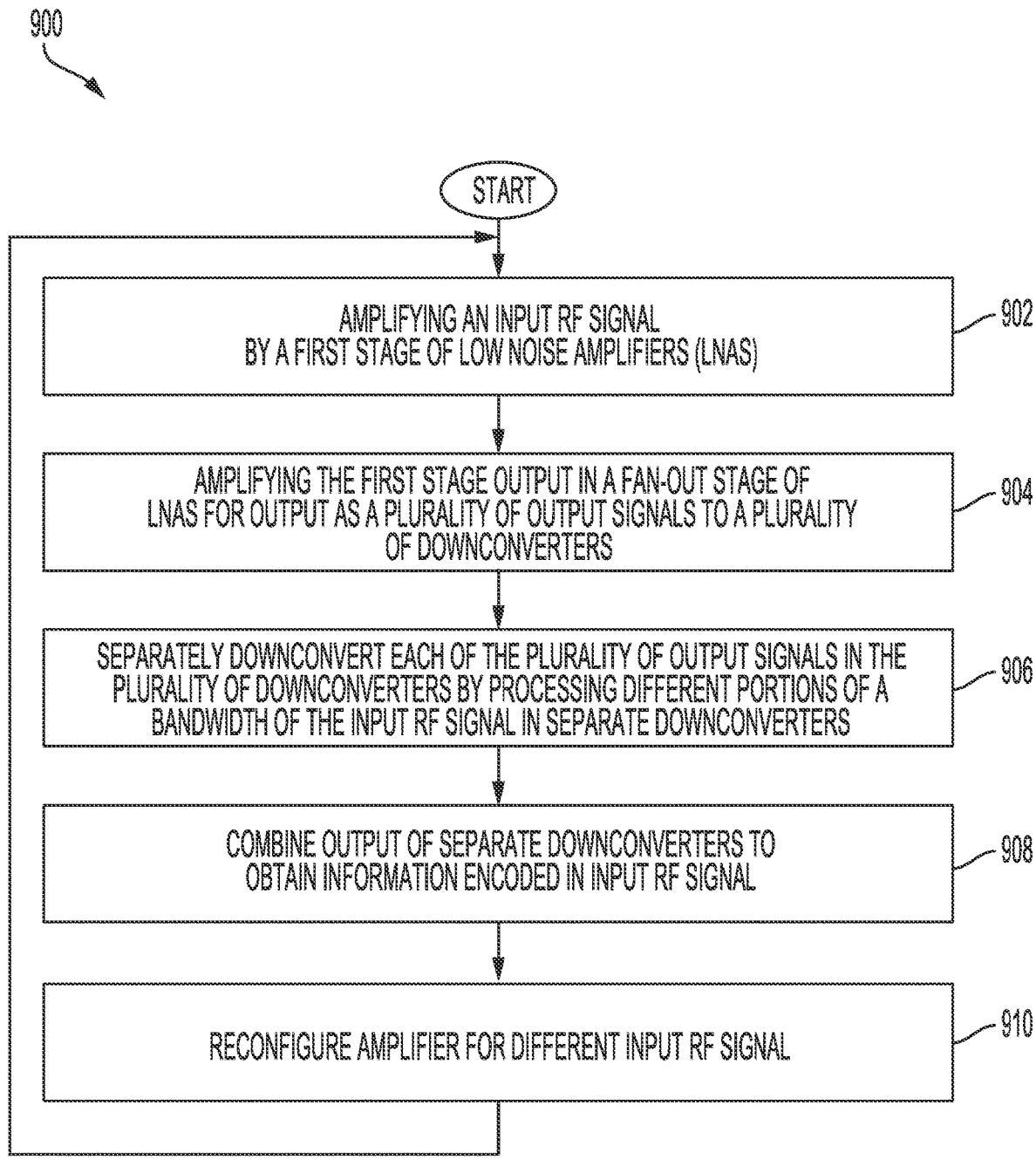
FIG. 9 is a flow chart illustrating a method of processing RF signals in a fan-out amplifier with inductor-less LNAs according to one or more aspects.

A flow chart for operating a receiver circuit to share downconversion circuitry between different RF signal types is shown in FIG. 9. FIG. 9 is a flow chart illustrating a method of processing RF signals in a fan-out amplifier with inductor-less LNAs according to one or more aspects. A method 900 begins at block 902 with amplifying an input RF signal by a first stage of inductor-less low noise amplifiers (LNAs). The input RF signal may have a bandwidth larger than any one of the mixers or downconverters coupled to the LNAs can process. For example, the baseband filters (BBFs) of the downconverters may have cutoffs that block the entire bandwidth of the received RF signal for a 5G mmWave RF signal. The term RF signal does not necessarily indicate that the signal which is amplified at block 902 has the same frequency as it did when it was received at an antenna. For example, 5G mmWave RF signal may be amplified at an intermediate frequency. Some signals, however, may be amplified at approximately the same frequency as they were received at an antenna.

At block 904, the output of the first stage LNAs is amplified in a fan-out stage having inductor-less LNAs. The fan-out stage may perform amplification for providing a subset of carriers at each of the plurality of amplifier output nodes, the subset of carriers being a subset of carriers from the RF input signal. The amplification of block 904 may generate a fan-out of multiple amplifier output nodes that provide inter-band splitting of a plurality of carriers in the input RF signal and/or intra-band splitting of a plurality of carriers in the input RF signal. In a three-stage amplifier, block 904 may include amplifying the first stage output for output as a plurality of second stage output signals at a plurality of second stage output nodes with a second stage of inductor-less LNAs and also include amplifying the second stage output signals for output on the plurality of amplifier output nodes with a third stage of inductor-less LNAs. In a four-stage amplifier, block 904 may include amplifying the first signals for output on a plurality of second stage output signals at a plurality of second stage output nodes with a second stage of inductor-less LNAs; amplifying the second stage output signals for output on a plurality of third stage output nodes with a third stage of inductor-less LNAs; and amplifying the third stage output signals for output on the plurality of amplifier output nodes with a fourth stage of inductor-less LNAs. The four-stage amplification may perform carrier splitting such that amplifying with the second stage of inductor-less LNAs comprises inter-band splitting of a plurality of carriers in the input RF signal; amplifying with the third stage of inductor-less LNAs comprises intra-band carrier group splitting of a plurality of carriers in the RF input signal; and amplifying with the fourth stage of inductor-less LNAs comprises intra-band carrier aggregation splitting of a plurality of carriers in the input RF signal.

At block 906, the output of the fan-out stage LNAs may be separately downconverted in a plurality of mixers by processing different portions of a bandwidth of the input RF signal in separate mixers. Each of the mixers may be tuned to a different bandwidth center with a local oscillator signal to achieve downconversion of different portions of the bandwidth of the input RF signal. Each of the downconverted signals may be filtered in a respective BBF, and converted to a digital signal by a respective ADC.

At block 908, the digital outputs of the downconverters are combined in digital logic circuitry to obtain the information originally encoded in the input RF signal. An example input RF signal for processing in blocks 902, 904, and 906 may be a 5G mmWave RF signal with a bandwidth that is processed in smaller portions in each of the downconverters.

The sharing of the downconverters allows the downconverters to be reused for processing other RF signals. For example, the mobile device may switch radio modes from processing 5G mmWave RF signals and be assigned resources in the wireless network for receiving information on a 5G sub-6 GHz RF signal. At block 910, the first stage of inductor-less LNAs is reconfigured to amplify a different input RF signal, which in this example is the 5G sub-6 GHz RF signal, which is then amplified in the first stage at block 902 and the fan-out stage at block 904. The fan-out stage may be reconfigured to process individual carriers within the 5G sub-6 GHz RF signal, which may be a single carrier or multiple carriers when operating in carrier aggregation (CA) mode. The reconfiguration at block 910 may include disabling at least one of the inductor-less LNAs based on a power combining control signal. For example, a power combining control signal may be used to toggle operation of a LNA in the first stage. The reconfiguration at block 910 may also or alternatively include adjusting a configurable feedback loop of at least one inductor-less LNA of the fan-out stage. Adjusting the configurable feedback loop may include disabling at least one of the inductor-less LNAs of the fan-out stage; and matching impedance of the at least one inductor-less LNA of the fan-out stage to the first stage of inductor-less LNAs in response to disabling at least one of the inductor-less LNAs of the fan-out stage.

Figure 10A:
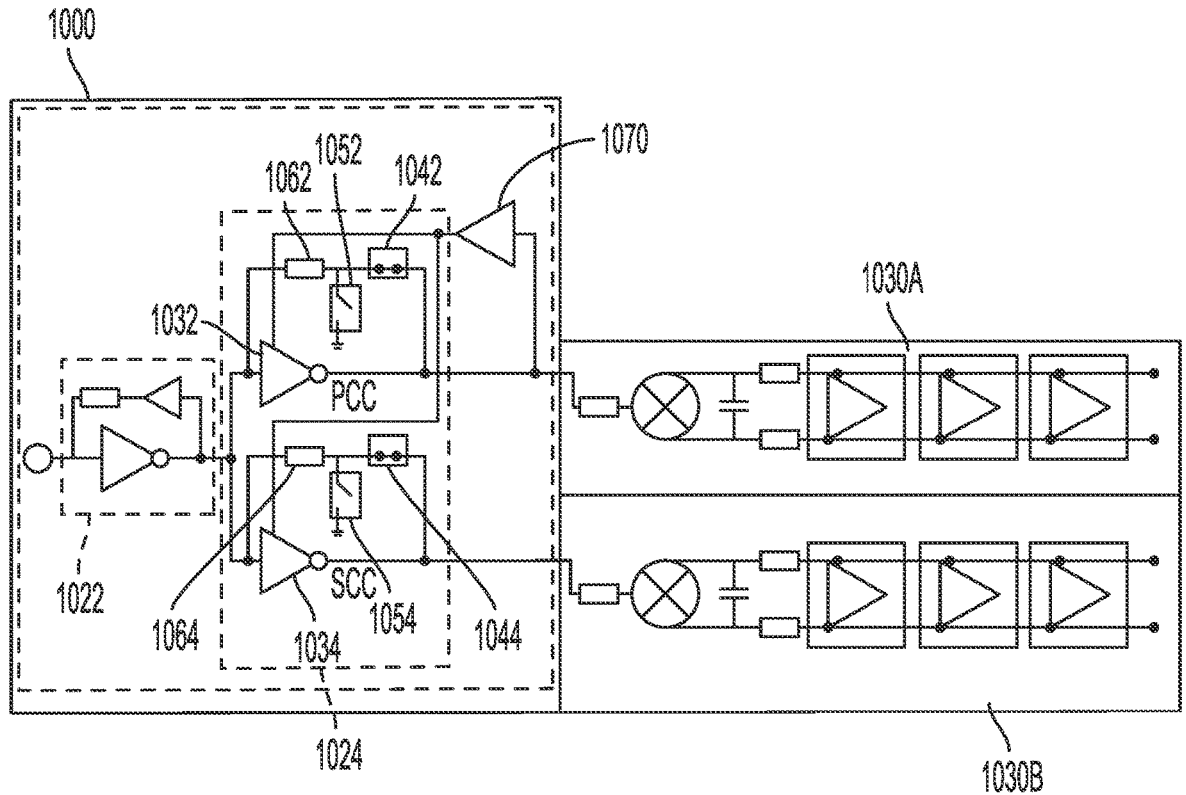
FIG. 10A is a circuit schematic illustrating a two-stage fan-out amplifier with inductor-less LNAs having reconfigurable feedback loops according to one or more aspects.
Figure 10B:
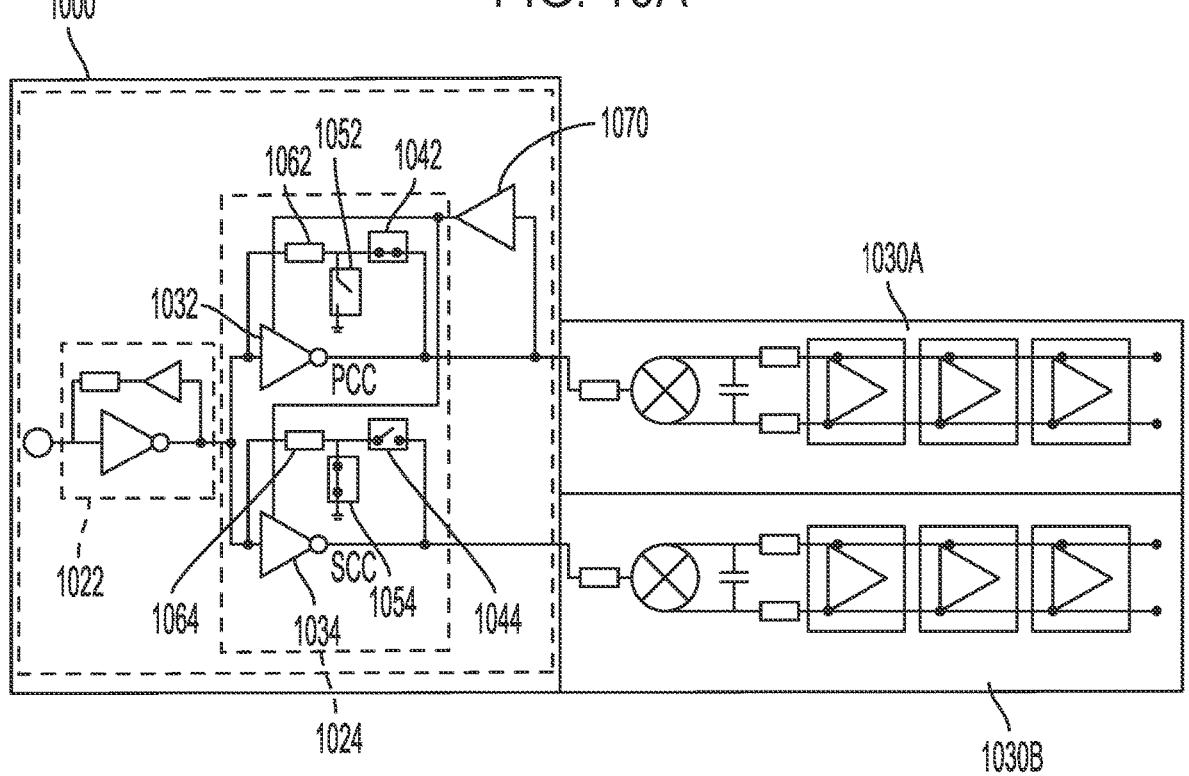
FIG. 10B is a circuit schematic illustrating the two-stage fan-out amplifier of FIG. 10A with one inductor-less LNA disabled according to one or more aspects.

The fan-out stage of the amplifier may provide impedance matching for the first stage of the amplifier in any of the examples described above. LNAs in the fan-out stage may be configured to provide a configurable impedance to allow further matching to the first stage of the amplifier. An example of configurable impedance is illustrated in FIG. 10A. FIG. 10A is a circuit schematic illustrating a two-stage fan-out amplifier with inductor-less LNAs having reconfigurable feedback loops according to one or more aspects. Amplifier 1000 may include a first stage 1022 and a fan-out stage 1024. The fan-out stage 1024 may have two amplifier output nodes coupled to downconverters 1030A and 1030B. The fan-out stage 1024 may include two inductor-less LNAs 1032 and 1034, as illustrated, or a greater number of LNAs. Feedback paths around the LNAs 1032, 1034 may include switches 1042, 1044, switches 1052, 1054, and impedances 1062, 1064, respectively. The switches may be toggled and/or the impedances adjusted to provide impedance matching to the first stage 1022. For example, when one of the LNAs 1032 or 1034 is disabled, a feedback path around that LNA may be configured to shunt the output of the first stage 1022 to ground by toggling the respective one of the switches 1042 or 1044 and the switches 1052 or 1054. One such reconfiguration for shunting the LNA 1034 to ground is shown in FIG. 10B. The LNA 1034 may be powered off, and the feedback path around LNA 1034 reconfigured by opening switch 1044 and closing switch 1054. In some examples, the impedances 1062, 1064 include a resistor and/or a capacitor. For example, the impedances 1062, 1064 may include a resistor and a capacitor coupled in series. In some examples, one or both of the resistor and capacitor are variable. In some examples, a value of the resistor and/or capacitor are set and the feedback path shunted to ground (as in FIG. 10B) so as to present a shunt (capacitive) dummy load to the first stage 1022. For example, a total load presented to the first stage 1022 by the LNAs (active or inactive) in the fan-out stage 1024 may be adjusted so as to maintain an impedance between the first stage 1022 and fan-out stage 1024 approximately constant, and/or controlled to present a desired load/impedance, for example based on the number of LNAs in the fan-out stage which are active and/or a type of signal being amplified. In some examples, adjusting the loads presented by the feedback path reduces the likelihood and/or severity of a glitch when switching in/out (or activating/deactivating) LNAs in the fan-out stage 1024.

As illustrated in FIG. 10, in some examples an (e.g., operational) amplifier 1070 is coupled between an output of an LNA in the fan-out stage 1024 and a bias node of the LNA. In this configuration, an input of the amplifier 1070 is coupled to an output of the LNA 1032, which may be configured to provide a PCC. The output of the amplifier 1070 is coupled to a bias node of the LNA 1032. In some such examples, the output of the amplifier 1070 is further coupled to a bias node of the LNA 1034 and/or to a bias node of all other LNAs in a first stage of the fan-out stage 1024. The configurable impedance or any aspect of the reconfigurable feedback loop described with respect to FIG. 10 may be implemented in any of the amplifiers describes with respect to the previous figures (e.g., amplifiers in the stage 424, 532, 534, 632, 634, 636, 724, and/or 824).

Figure 11:
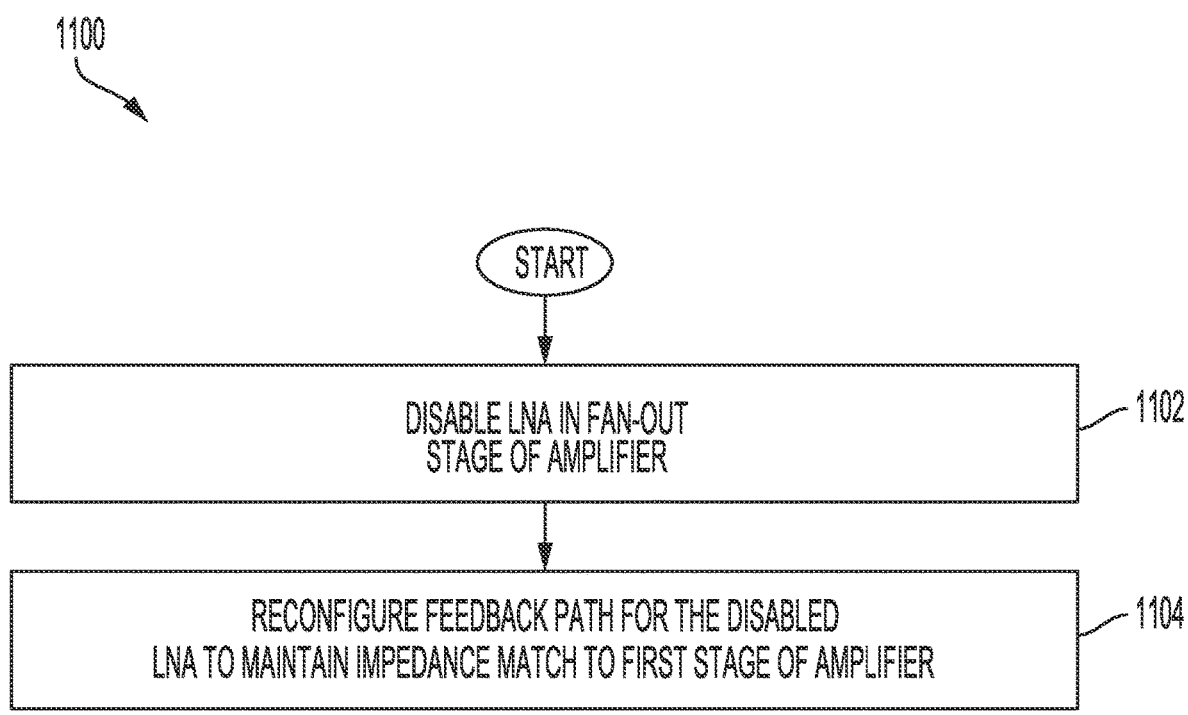
FIG. 11 is a flow chart illustrating a method of reconfiguring a fan-out amplifier with inductor-less LNAs according to one or more aspects.

A method for reconfiguring LNAs in a fan-out stage of an amplifier is shown in FIG. 11. FIG. 11 is a flow chart illustrating a method of reconfiguring a fan-out amplifier with inductor-less LNAs according to one or more aspects. A method 1100 may begin at block 1102 with disabling an inductor-less LNA within a fan-out stage of an amplifier, which may be a result of a change in carrier configuration of the mobile device that deactivates carrier aggregation or changes from 5G mmWave RF signals to 5G sub-6 Ghz RF signals. At block 1104, the feedback path around the deactivated inductor-less LNA may be reconfigured to maintain impedance match to a first stage of the amplifier.

Circuits and/or methods described herein may result in one or more benefits. For example, noise figure may be improved as compared to previous approaches, power consumption may be reduced, area and/or cost may be reduced, and/or devices with increased flexibility and/or configurability may be implemented.

In one or more aspects, techniques for supporting wireless communication by processing radio frequency (RF) signals may include additional aspects, such as any single aspect or any combination of aspects described below or in connection with one or more other processes or devices described elsewhere herein. In one or more aspects, supporting wireless operations may include an apparatus having a fan-out amplifier and one or more improved LNAs. Additionally, the apparatus may perform or operate according to one or more aspects as described below. In some implementations, the apparatus includes a wireless device, such as a UE or a BS. In some implementations, the apparatus may include at least one processor, and a memory coupled to the processor. The processor may be configured to perform operations described herein with respect to the apparatus, such as described in FIG. 9 and/or FIG. 11. In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein. In some implementations, a method of wireless communication may include one or more operations described herein with reference to the apparatus.

In a first aspect, an apparatus includes at least one input node; a plurality of amplifier output nodes; and/or an amplifier connected to the at least one input node and to the plurality of amplifier output nodes, and configured to amplify RF signals input at the input node for output at the plurality of amplifier output nodes, the amplifier comprising a first stage comprising at least one first low noise amplifier (LNA) configured to be coupled to the at least one input node and to at least one first stage output node; and/or a fan-out stage comprising at least two second LNAs configured to be coupled to the at least one first stage output node and to the plurality of amplifier output nodes.

In a second aspect, in combination with the first aspect, the at least two second LNAs are configured to provide a matched impedance to the at least one first LNA.

In a third aspect, alone or in combination with one or more of the first aspect or the second aspect, the first stage comprises an inductor-less LNA.

In a fourth aspect, alone or in combination with one or more of the first aspect through the third aspect, the inductor-less LNA comprises a gyrator LNA (gLNA).

In a fifth aspect, alone or in combination with one or more of the first aspect through the fourth aspect, the at least two second LNAs are configured to each provide at least a subset of frequency bands of carriers at each of the plurality of amplifier output nodes, the subset of frequency bands of carriers being from a plurality of carriers in the RF signals.

In a sixth aspect, alone or in combination with one or more of the first aspect through the fifth aspect, the apparatus includes a plurality of downconverters, each of the plurality of downconverters is separately coupled to a respective one the plurality of amplifier output nodes, and the downconverters are each configured to process a portion of a bandwidth of the RF signals received at the input node.

In a seventh aspect, alone or in combination with one or more of the first aspect through the sixth aspect, some of the plurality of downconverters are configured to provide carrier aggregation (CA) processing for 5G sub-6 GHz RF signals, and wherein others of the plurality of downconverters are configured to provide 5G mmWave processing for 5G mmWave RF signals.

In an eighth aspect, alone or in combination with one or more of the first aspect through the seventh aspect, the at least two second LNAs of the fan-out stage comprise: a second stage of LNAs configured to be coupled to a common input at the at least one first stage output node, and configured to output signals to a plurality of second stage output nodes; and/or a third stage of LNAs comprising at least two sets of LNAs with each of the at least two sets configured to be coupled to a respective one of the plurality of second stage output node, and each LNA of the at least two sets is configured to output signals to a respective amplifier output node of the plurality of amplifier output nodes.

In a ninth aspect, alone or in combination with one or more of the first aspect through the eighth aspect, the third stage of LNAs are configured to each output at least a subset of frequency bands of carriers at the respective amplifier output node.

In a tenth aspect, alone or in combination with one or more of the first aspect through the ninth aspect, the second stage of LNAs is configured to perform inter-band splitting of a plurality of carriers in the RF signals and/or the third stage of LNAs is configured to perform intra-band splitting of a plurality of carriers in the RF signals.

In an eleventh aspect, alone or in combination with one or more of the first aspect through the tenth aspect, the at least two second LNAs of the fan-out stage comprise: a second stage of LNAs configured to be coupled to a common input at the at least one first stage output node and configured to output signals to a plurality of second stage output nodes, the second stage of LNAs comprising two or more LNAs; a third stage of LNAs comprising at least two sets of LNAs with each of the at least two sets configured to be coupled to a common input at the plurality of second stage output nodes, the third stage of LNAs configured to output signals to a plurality of third stage output nodes, each of the at least two sets of LNAs comprising two or more LNAs; and/or a fourth stage of LNAs comprising at least four sets of LNAs with each of the at least four sets configured to be coupled to a common input at the plurality of third stage output nodes, the fourth stage of LNAs configured to output signals to the plurality of amplifier output nodes.

In a twelfth aspect, alone or in combination with one or more of the first aspect through the eleventh aspect, the second stage of LNAs is configured to perform inter-band splitting of a plurality of carriers in the RF signals, the third stage of LNAs is configured to perform intra-band carrier group splitting of the plurality of carriers in the RF signals, and/or the fourth stage of LNAs is configured to perform intra-band carrier aggregation splitting of the plurality of carriers in the RF signals.

In a thirteenth aspect, alone or in combination with one or more of the first aspect through the twelfth aspect, the first stage comprises at least two first LNAs configured to be coupled in parallel between respective ones of the at least one input node and the at least one first stage output node.

In a fourteenth aspect, alone or in combination with one or more of the first aspect through the thirteenth aspect, at least one of the at least two first LNAs is configured to be activated and deactivated based on a power combining control signal.

In a fifteenth aspect, alone or in combination with one or more of the first aspect through the fourteenth aspect, the configurable feedback loop is configured to obtain a desired load at the at least one first stage output node.

In a sixteenth aspect, alone or in combination with one or more of the first aspect through the fifteenth aspect, the at least two second LNAs of the fan-out stage comprise a second stage of LNAs configured to be coupled to a common input at the at least one first stage output node, and wherein the configurable feedback loop is configurable to match impedance to the at least one first LNA of the first stage when turning off at least one of the at least two second LNAs.

In a seventeenth aspect, alone or in combination with one or more of the first aspect through the sixteenth aspect, the at least two second LNAs of the fan-out stage comprise a second stage of LNAs, wherein the second stage is configured to be coupled to: a first LNA of the first stage corresponding to a first wireless technology; and/or a second LNA of another first stage corresponding to a second wireless technology.

In an eighteenth aspect, alone or in combination with one or more of the first aspect through the seventeenth aspect, the fan-out stage comprises: a first set of second-stage LNAs; a second set of second-stage LNAs; a first switch configured to couple together inputs of the first set of second-stage LNAs; a second switch configured to couple together inputs of the second set of second-stage LNAs; a third switch configured to couple the first set of second-stage LNAs to a first LNA of the at least one first LNA; and/or a fourth switch configured to couple the second set of second-stage LNAs to a second LNA of the at least one first LNA.

In a nineteenth aspect, alone or in combination with one or more of the first aspect through the eighteenth aspect, the apparatus includes a first set of downconverters configured to be coupled to the first set of second-stage LNAs; and/or a second set of downconverters configured to be coupled to the second set of second-stage LNAs.

In a twentieth aspect, alone or in combination with one or more of the first aspect through the nineteenth aspect, a first downconverter of the first set of downconverters is further configured to be coupled to a third LNA of another first stage, and/or a first downconverter of the second set of downconverters is further configured to be coupled to a fourth LNA of yet another first stage.

In a twenty-first aspect, alone or in combination with one or more of the first aspect through the twentieth aspect, the apparatus includes another first stage coupled between another input node and the fan-out stage, wherein: the another first stage is configured to amplify 5G sub-6 GHz signals; and/or the first stage is configured to amplify 5G mmWave RF signals.

In a twenty-second aspect, alone or in combination with one or more of the first aspect through the twenty-first aspect, a downconverter of the first set of downconverters is configured to process at least one of the 5G sub-6 GHz signals, and configured to process a portion of at least one of the 5G mmWave RF signals.

In a twenty-third aspect, alone or in combination with one or more of the first aspect through the twenty-second aspect, the configurable feedback loop comprises switches configured to couple an input of the at least one of the at least two second LNAs to either ground or an output of the at least one of the at least two second LNAs.

In a twenty-fourth aspect, alone or in combination with one or more of the first aspect through the twenty-third aspect, the fan-out stage comprises an amplifier configured to be coupled between an output of the at least one of the at least two second LNAs and bias nodes of the at least two second LNAs.

In a twenty-fifth aspect, alone or in combination with one or more of the first aspect through the twenty-fourth aspect, at least one of the at least two second LNAs comprises a configurable feedback loop.

In a twenty-sixth aspect, alone or in combination with one or more of the first aspect through the twenty-fifth aspect, at least one of the at least two second LNAs comprises an inductor-less LNA.

In a twenty-seventh aspect, alone or in combination with one or more of the first aspect through the twenty-sixth aspect, the inductor-less LNA comprises a gyrator LNA (gLNA).

In a twenty-eighth aspect, alone or in combination with one or more of the first aspect through the twenty-seventh aspect, a method of wireless communications includes amplifying RF signals received at an amplifier input node by a first stage of low noise amplifiers (LNAs) for output as first signals on at least one first stage output node; amplifying the first signals by a fan-out stage of LNAs for output as amplifier output signals on a plurality of amplifier output nodes; and/or adjusting a configurable feedback loop of at least one LNA of the fan-out stage to match impedance between the fan-out stage and the first stage.

In a twenty-ninth aspect, alone or in combination with one or more of the first aspect through the twenty-eighth aspect, a method of wireless communications includes downconverting the amplifier output signals from the plurality of amplifier output nodes by processing a portion of a bandwidth of the RF signals in each of a plurality of mixers.

In a thirtieth aspect, alone or in combination with one or more of the first aspect through the twenty-ninth aspect, downconverting the amplifier output signals comprises: downconverting separate carriers of the amplifier output signals through separate mixers of the plurality of mixers when the RF signals comprises carrier aggregation (CA) 5G sub-6 GHz RF signals; and/or downconverting separate portions of a bandwidth of the RF signals through separate mixers of the plurality of mixers when the RF signals comprises 5G mmWave RF signals.

In a thirty-first aspect, alone or in combination with one or more of the first aspect through the thirtieth aspect, a method of wireless communications includes disabling the at least one LNA of the fan-out stage, wherein adjusting the configurable feedback loop comprises matching the impedance of the fan-out stage to the first stage of LNAs in response to disabling the at least one LNA of the fan-out stage.

In a thirty-second aspect, alone or in combination with one or more of the first aspect through the thirty-first aspect, matching the impedance of the fan-out stage comprises shunting the configurable feedback loop of the deactivated at least one LNA to ground.

In a thirty-third aspect, an apparatus for wireless communications includes means for amplifying RF signals input at an amplifier input node for output as first signals on at least one first stage output node; and/or means for fanning out the first signals for output as amplifier output signals on a plurality of amplifier output nodes, wherein the means for fanning out comprises means for maintaining an impedance between the means for amplifying and the means for fanning out when components of the means for fanning out are activated or deactivated.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIG. 1, FIG. 2, FIG. 3, FIG. 4, FIG. 5, FIG. 6, FIG. 7, FIG. 8A, FIG. 8B, FIG. 8C, FIG. 8D, FIG. 10A, and/or FIG. 10B include some or all of processors, electronics devices, hardware devices, electronics components, logical circuits, memories, software codes, firmware codes, among other examples, or any combination thereof. In addition, features discussed herein may be implemented via specialized processor circuitry, via executable instructions, or combinations thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, that is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if an apparatus is described as containing components A, B, or C, the apparatus may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus, comprising:
   at least one input node;
   a plurality of amplifier output nodes;
   an amplifier connected to the at least one input node and to the plurality of amplifier output nodes, and configured to amplify RF signals input at the input node for output at the plurality of amplifier output nodes, the amplifier comprising:
   a first stage comprising at least one first low noise amplifier (LNA) configured to be coupled to the at least one input node and to at least one first stage output node; and
   a fan-out stage comprising at least two second LNAs configured to be coupled to the at least one first stage output node and to the plurality of amplifier output nodes, wherein the at least two second LNAs are configured to provide a matched impedance to the at least one first LNA.

2. The apparatus of claim 1, wherein the first stage comprises an inductor-less LNA.

3. The apparatus of claim 2, wherein the inductor-less LNA comprises a gyrator LNA (gLNA).

4. The apparatus of claim 1, wherein the at least two second LNAs are configured to each provide at least a subset of frequency bands of carriers at each of the plurality of amplifier output nodes, the subset of frequency bands of carriers being from a plurality of carriers in the RF signals.

5. The apparatus of claim 4, further comprising:
   a plurality of downconverters,
   wherein each of the plurality of downconverters is separately coupled to a respective one the plurality of amplifier output nodes, and
   wherein the downconverters are each configured to process a portion of a bandwidth of the RF signals received at the input node.

6. The apparatus of claim 5, wherein some of the plurality of downconverters are configured to provide carrier aggregation (CA) processing for 5G sub-6 GHz RF signals, and wherein others of the plurality of downconverters are configured to provide 5G mmWave processing for 5G mmWave RF signals.

7. The apparatus of claim 1, wherein the at least two second LNAs of the fan-out stage comprise:
   a second stage of LNAs configured to be coupled to a common input at the at least one first stage output node, and configured to output signals to a plurality of second stage output nodes; and
   a third stage of LNAs comprising at least two sets of LNAs with each of the at least two sets configured to be coupled to a respective one of the plurality of second stage output node, and each LNA of the at least two sets is configured to output signals to a respective amplifier output node of the plurality of amplifier output nodes.

8. The apparatus of claim 7, wherein the third stage of LNAs are configured to each output at least a subset of frequency bands of carriers at the respective amplifier output node.

9. The apparatus of claim 7,
   wherein the second stage of LNAs is configured to perform inter-band splitting of a plurality of carriers in the RF signals, and
   wherein the third stage of LNAs is configured to perform intra-band splitting of a plurality of carriers in the RF signals.

10. The apparatus of claim 1, wherein the at least two second LNAs of the fan-out stage comprise:
    a second stage of LNAs configured to be coupled to a common input at the at least one first stage output node and configured to output signals to a plurality of second stage output nodes, the second stage of LNAs comprising two or more LNAs;
    a third stage of LNAs with each of the at least two sets configured to be coupled to a common input at the plurality of second stage output nodes, the third stage of LNAs configured to output signals to a plurality of third stage output nodes, each of the at least two sets of LNAs comprising two or more LNAs; and
    the fan-out stage further comprising a fourth stage of LNAs comprising at least four sets of LNAs with each of the at least four sets configured to be coupled to a common input at the plurality of third stage output nodes, the fourth stage of LNAs configured to output signals to the plurality of amplifier output nodes.

11. The apparatus of claim 10,
    wherein the second stage of LNAs is configured to perform inter-band splitting of a plurality of carriers in the RF signals,
    wherein the third stage of LNAs is configured to perform intra-band carrier group splitting of the plurality of carriers in the RF signals, and
    wherein the fourth stage of LNAs is configured to perform intra-band carrier aggregation splitting of the plurality of carriers in the RF signals.

12. The apparatus of claim 1, wherein the first stage comprises at least two first LNAs configured to be coupled in parallel between respective ones of the at least one input node and the at least one first stage output node.

13. The apparatus of claim 12, wherein at least one of the at least two first LNAs is configured to be activated and deactivated based on a power combining control signal.

14. The apparatus of claim 1, wherein at least one of the at least two second LNAs comprises a configurable feedback loop.

15. The apparatus of claim 14, wherein the at least two second LNAs of the fan-out stage comprise a second stage of LNAs configured to be coupled to a common input at the at least one first stage output node, and wherein the configurable feedback loop is configurable to match impedance to the at least one first LNA of the first stage when turning off at least one of the at least two second LNAs.

16. The apparatus of claim 1, wherein the at least two second LNAs of the fan-out stage comprise a second stage of LNAs, wherein the second stage of LNAs is configured to be coupled to:
a first LNA of the first stage corresponding to a first wireless technology; and
a second LNA of another first stage corresponding to a second wireless technology.

17. The apparatus of claim 16, wherein the fan-out stage comprises:
a first set of second-stage LNAs;
a second set of second-stage LNAs;
a first switch configured to couple together inputs of the first set of second-stage LNAs;
a second switch configured to couple together inputs of the second set of second-stage LNAs;
a third switch configured to couple the first set of second-stage LNAs to a first LNA of the at least one first LNA; and
a fourth switch configured to couple the second set of second-stage LNAs to a second LNA of the at least one first LNA.

18. The apparatus of claim 17, further comprising:
a first set of downconverters configured to be coupled to the first set of second-stage LNAs; and
a second set of downconverters configured to be coupled to the second set of second-stage LNAs.

19. The apparatus of claim 18, wherein:
a first downconverter of the first set of downconverters is further configured to be coupled to a third LNA of another first stage; and
a first downconverter of the second set of downconverters is further configured to be coupled to a fourth LNA of yet another first stage.

20. The apparatus of claim 18, further comprising another first stage coupled between another input node and the fan-out stage, wherein:
the another first stage is configured to amplify 5G sub-6 GHz signals; and
the first stage is configured to amplify 5G mmWave RF signals.

21. The apparatus of claim 20, wherein a downconverter of the first set of downconverters is configured to process at least one of the 5G sub-6 GHz signals, and configured to process a portion of at least one of the 5G mmWave RF signals.

22. The apparatus of claim 14, wherein the configurable feedback loop comprises switches configured to couple an input of the at least one of the at least two second LNAs to either ground or an output of the at least one of the at least two second LNAs.

23. The apparatus of claim 1, wherein the fan-out stage comprises an amplifier configured to be coupled between an output of the at least one of the at least two second LNAs and bias nodes of the at least two second LNAs.

24. The apparatus of claim 14, wherein the configurable feedback loop is configured to obtain a desired load at the at least one first stage output node.

25. The apparatus of claim 1, wherein at least one of the at least two second LNAs comprises an inductor-less LNA.

26. The apparatus of claim 25, wherein the inductor-less LNA comprises a gyrator LNA (gLNA).

27. A method, comprising:
amplifying RF signals received at an amplifier input node by a first stage of low noise amplifiers (LNAs) for output as first signals on at least one first stage output node;
amplifying the first signals by a fan-out stage of LNAs for output as amplifier output signals on a plurality of amplifier output nodes; and
adjusting a configurable feedback loop of at least one LNA of the fan-out stage of LNAs to match impedance between the fan-out stage of LNAs and the first stage of LNAs.

28. The method of claim 27, further comprising:
downconverting the amplifier output signals from the plurality of amplifier output nodes by processing a portion of a bandwidth of the RF signals in each of a plurality of mixers.

29. The method of claim 28, wherein downconverting the amplifier output signals comprises:
downconverting separate carriers of the amplifier output signals through separate mixers of the plurality of mixers when the RF signals comprises carrier aggregation (CA) 5G sub-6 GHz RF signals; and
downconverting separate portions of a bandwidth of the RF signals through separate mixers of the plurality of mixers when the RF signals comprises 5G mmWave RF signals.

30. The method of claim 27, further comprising deactivating the at least one LNA of the fan-out stage, wherein adjusting the configurable feedback loop comprises matching the impedance of the fan-out stage to the first stage of LNAs in response to deactivating the at least one LNA of the fan-out stage.

31. The method of claim 30, wherein matching the impedance of the fan-out stage comprises shunting the configurable feedback loop of the at least one LNA to ground.

32. An apparatus, comprising:
means for amplifying RF signals input at an amplifier input node for output as first signals on at least one first stage output node; and
means for fanning out the first signals for output as amplifier output signals on a plurality of amplifier output nodes, wherein the means for fanning out comprises means for maintaining an impedance between the means for amplifying and the means for fanning out when components of the means for fanning out are activated or deactivated.

* * * * *